(12) United States Patent
Hall et al.

(10) Patent No.: US 7,308,795 B2
(45) Date of Patent: Dec. 18, 2007

(54) METHOD AND SYSTEM FOR COOLING ELECTRICAL COMPONENTS DOWNHOLE

(76) Inventors: David R. Hall, 738 E. 2380 North, Provo, UT (US) 84606; Joe Fox, 572 S. 1750 East, Spanish Fork, UT (US) 84660

( * ) Notice: Subject to any disclaimer, the term of this patent is extended or adjusted under 35 U.S.C. 154(b) by 491 days.

(21) Appl. No.: 11/008,467

(22) Filed: Dec. 8, 2004

(65) Prior Publication Data

US 2006/0117759 A1  Jun. 8, 2006

(51) Int. Cl.
F25B 21/02 (2006.01)
(52) U.S. Cl. ............................................. 62/3.2; 166/66
(58) Field of Classification Search ............ 62/3.1–3.7, 62/259.2; 166/66
See application file for complete search history.

(56) References Cited

U.S. PATENT DOCUMENTS

| 3,488,970 | A | * | 1/1970 | Hallenburg | .................... | 62/3.2 |
| 4,578,675 | A | * | 3/1986 | MacLeod | ................. | 340/853.7 |
| 5,931,000 | A | * | 8/1999 | Turner et al. | .................. | 62/3.2 |
| 6,134,892 | A | * | 10/2000 | Turner et al. | .................. | 62/3.2 |
| 6,150,601 | A | * | 11/2000 | Schnatzmeyer et al. | .... | 136/201 |
| 6,467,557 | B1 | * | 10/2002 | Krueger et al. | ............... | 175/45 |
| 6,769,487 | B2 | * | 8/2004 | Hache | ......................... | 166/302 |
| 6,942,044 | B2 | * | 9/2005 | Moore et al. | .................. | 175/45 |
| 7,190,084 | B2 | * | 3/2007 | Hall et al. | ................... | 290/1 R |
| 2006/0086506 | A1 | * | 4/2006 | Golla et al. | .................. | 166/302 |

* cited by examiner

Primary Examiner—William E. Tapolcai
(74) Attorney, Agent, or Firm—Daniel P. Nelson; Tyson J. Wilde

(57) ABSTRACT

A method and system that uses the flow of drilling fluid to cool electrical components in a downhole environment. A substantially cylindrical housing comprises a wall which houses at least one electrical component directly coupled to a thermoelectric cooling device. An opposing surface of the thermoelectric cooling device contacts a flow of drilling fluid through a hollow passageway in the wall. The flow of drilling fluid acts as a heat sink to transfer heat from the cooling device to a remote location. In this manner, heat is efficiently and directly transferred from the electrical component to the cooling device to the drilling fluid, while the location of the present system within a wall of the housing enables reliable protection of sensitive electrical components from hostile effects downhole.

22 Claims, 20 Drawing Sheets

METHOD AND SYSTEM FOR COOLING ELECTRICAL COMPONENTS DOWNHOLE

BACKGROUND OF THE INVENTION

1. Field of the Invention

The present invention relates to methods and systems for cooling electrical components in a downhole environment and, more particularly, to methods and systems utilizing a flow of drilling fluid to cool electrical components.

2. Background and Related Art

The goal of accessing data from a drill string has been expressed for more than half a century. As exploration and drilling technology has improved, this goal has become more important in the industry for successful oil, gas, and geothermal well exploration and production. For example, to take advantage of the several advances in the design of various tools and techniques for oil and gas exploration, it would be beneficial to have real time data such as temperature, pressure, inclination, salinity, etc. Several attempts have been made to devise a successful system for accessing such drill string data. However, due to the complexity, expense, and unreliability of such systems, many attempts to create such a system have failed to achieve significant commercial acceptance.

In numerous patents and pending patent applications issued to or filed by the present inventors, Hall et al. ("Hall"), the inventors have disclosed a downhole transmission system, or downhole network, that overcomes many of the problems and limitations of the prior art. In such a system, data is transmitted in real time along the drill string by way of network hardware integrated directly into the drill string. This network hardware enables high-speed communication between various tools and sensors located along the drill string with surface analysis, diagnostic, and control equipment.

The previously mentioned patents and pending patent applications thus solve many of the problems of the prior art by providing a reliable high-speed connection between downhole drilling components and the surface. Novel apparatus and methods are needed, however, to ensure that electrical components integral to such a downhole transmission system function properly and are not adversely affected by extreme operating parameters downhole.

Extreme temperatures downhole are of particular concern as such temperatures, which may exceed 150° C., cause a shorter performance life in electrical components, and may cause such components to fail completely. In addition, heat generated by the electrical components themselves may contribute to overheating and associated failure to function.

A downhole transmission system assumes proper functioning of electrical components. Failure of one or more electrical components integral to a downhole transmission system may cause inaccurate, delayed and/or failed information between the surface and a downhole tool, thereby compromising the reliability of the transmission system as well as the efficiency and success of the entire drilling operation.

Thermoelectric cooling devices comprising semiconductor-based electronic components that function as small solid state heat pumps are known in the art. Such devices, however, fail to adequately cool electrical components in a downhole environment since efficient use of such devices requires direct thermal transfer, a prospect generally thought to require unreasonable subjection of sensitive electrical components to other harmful effects downhole, such as extreme vibrations, impacts, abrasives, and pressures. Indeed, prior art systems that implement such thermoelectric devices, such as the system disclosed in U.S. Pat. No. 6,134,892 to Turner ("Turner"), allow certain thermoelectric transfer inefficiencies to ensure adequate protection of electrical components from other harmful effects. Specifically, Turner requires several heat transfer steps to achieve heat transfer across a plurality of protective materials and devices used to insulate electrical components from hostile effects downhole. With each heat transfer step, there is a commensurate reduction in cooling efficiency and increased risk of overheating and failure in electrical components.

Known cooling devices and systems also tend to interfere with a flow of drilling fluid through the drill string.

Accordingly, what is needed is an improved downhole thermoelectric cooling system that minimizes a number of heat transfer steps to maximize cooling efficiency. Further what is needed is an improved downhole thermoelectric cooling system capable of protecting electrical components from hostile effects downhole without compromising cooling efficiency. Also what is needed is an improved downhole thermoelectric cooling system that does not interfere with a flow of drilling fluid through a central borehole of a drill string.

Such methods and systems are disclosed and claimed herein.

SUMMARY OF THE INVENTION

The present invention is a method and system for effectively cooling electrical components in a downhole environment. Specifically, the present invention contemplates a substantially cylindrical housing integral to a drill string that houses electrical components therein. Unlike prior art systems, however, the electrical components may reside within a wall of the housing such that the wall functions to insulate and protect the components from harmful effects downhole. The wall may further comprise a hollow passageway proximate the electrical components, where the hollow passageway is adapted to accommodate and promote a flow of drilling fluid therethrough.

A thermoelectric cooling device in accordance with the present invention may be secured to an electrical component and exposed to the hollow passageway such that a flow of drilling fluid through the passageway directly contacts a surface of the cooler. In this manner, the flow of fluid acts as a heat sink to promote efficient heat transfer from the electrical component to an external location. Exposed portions of sensitive electrical components may be substantially encapsulated by a potting material, such as silicon rubber, to further protect the components from hostile effects downhole without compromising the efficiency of the thermoelectric heat transfer disclosed and claimed herein.

In certain embodiments, a miniature generator may be implemented within a portion of the hollow passageway to supply power to the thermoelectric cooling device. Specifically, a turbine may be rotatably secured in the hollow passageway such that a flow of drilling fluid causes the turbine to rotate. The turbine may be further coupled to a generator within the hollow passageway that generates electricity in response to the turbine's rotation. A generator may comprise a rotor and a stator. The rotor may be attached to the turbine and comprise at least one permanent magnet. The stator may reside substantially adjacent the rotor and comprise pot core coils. Rotation of the rotor causes a magnetic flux in the stator to generate electricity. A transformer coupled to the stator may convert generated electricity to usable voltage levels, which may be transmitted by a conductor to the thermoelectric cooling device, or to any other tool or device known to those in the art. The turbine and generator may comprise diamond, tungsten, carbide, or other natural or synthetic resin known to those in the art capable of withstanding extreme downhole conditions.

These and other features and advantages of the present invention will be set forth or will become more fully apparent in the description that follows and in the appended claims. The features and advantages may be realized and obtained by means of the instruments and combinations particularly pointed out in the appended claims. Furthermore, the features and advantages of the invention may be learned by the practice of the invention or will be obvious from the description, as set forth hereinafter.

BRIEF DESCRIPTION OF THE DRAWINGS

In order that the manner in which the above recited and other features and advantages of the present invention are obtained, a more particular description of the invention will be rendered by reference to specific embodiments thereof, which are illustrated in the appended drawings. Understanding that the drawings depict only typical embodiments of the present invention and are not, therefore, to be considered as limiting the scope of the invention, the present invention will be described and explained with additional specificity and detail through the use of the accompanying drawings in which.

DETAILED DESCRIPTION OF THE INVENTION

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

Many of the functional units described in this specification have been labeled as modules, in order to more particularly emphasize their implementation independence. For example, modules may be implemented in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module. For example, a module of executable code could be a single instruction, or many instructions, and may even be distributed over several different code segments, among different programs, and across several memory devices.

Modules may also be implemented in hardware as electronic circuits comprising custom VLSI circuitry, off-the-shelf semiconductors such as logic chips, transistors, or other discrete components. A module may also be implemented in programmable hardware devices such as field programmable gate arrays, programmable array logic, programmable logic devices, or the like. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Figure 1:
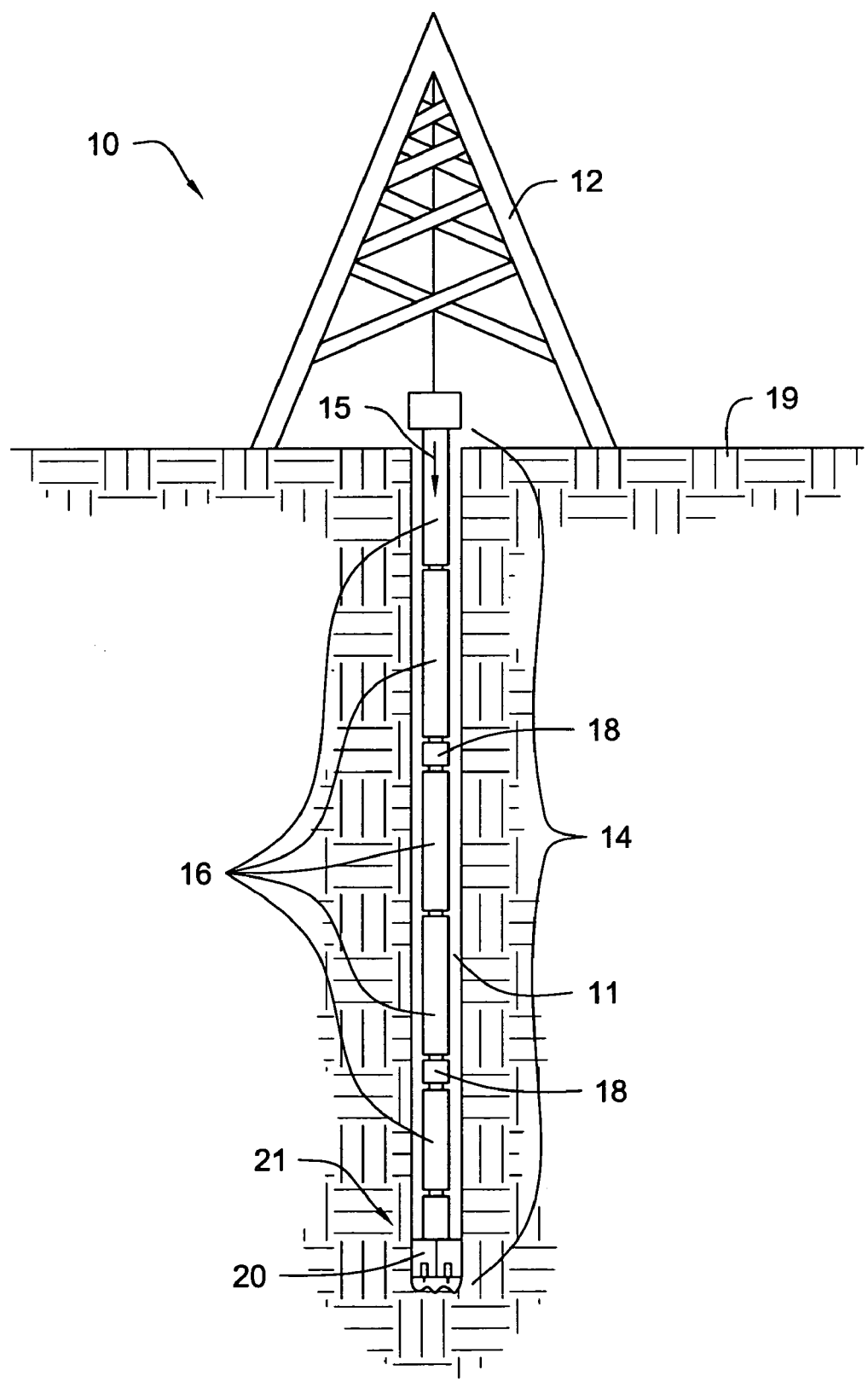
FIG. 1 is a profile view of one embodiment of a drill rig and drill string in accordance with the present invention.
Figure 2:
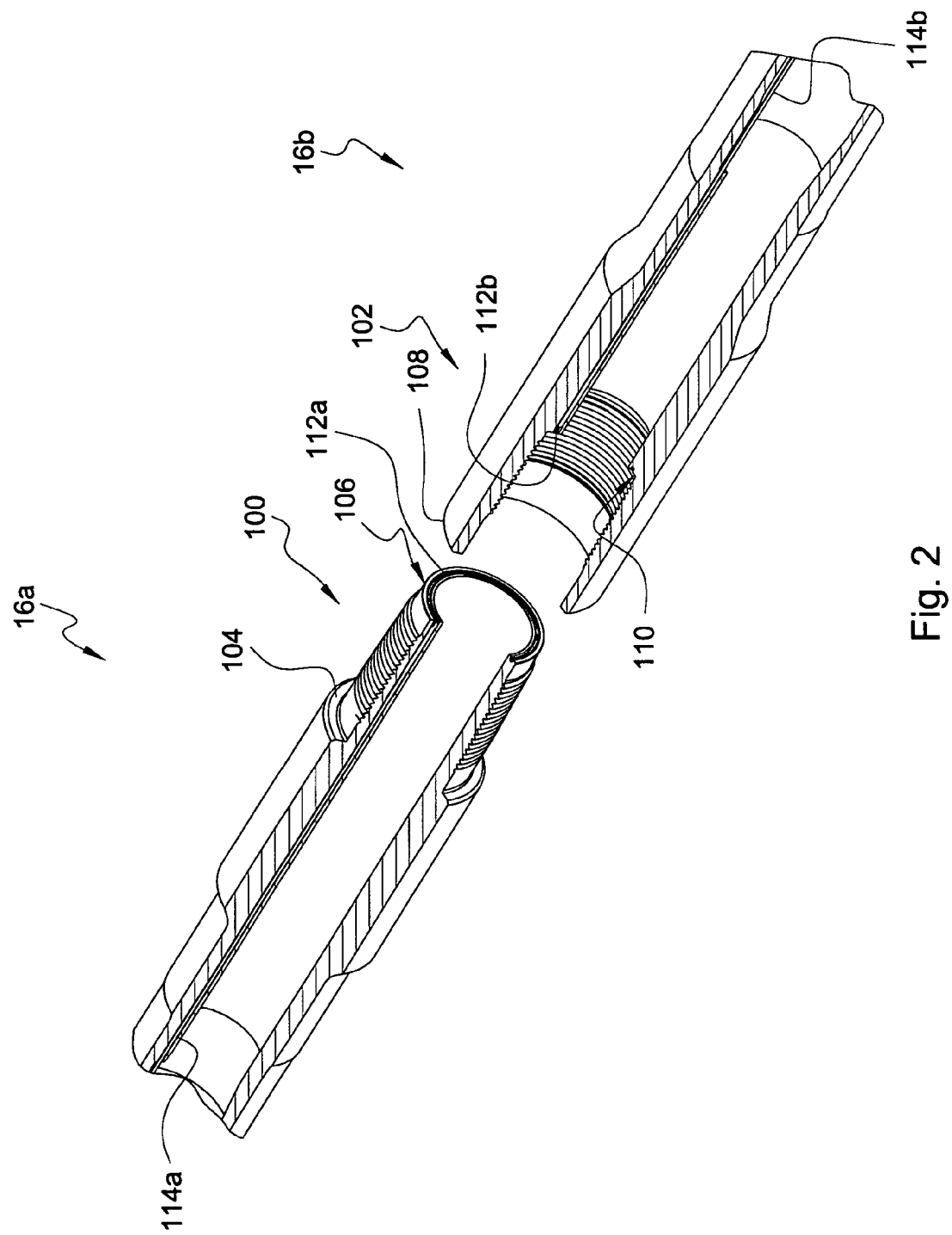
FIG. 2 is a perspective cross-sectional view of one embodiment of a downhole tool in accordance with the present invention, wherein the downhole tool includes a transmission line and transmission elements to transmit data along the drill string.

Referring to FIG. 1, a drill rig 10 may include a derrick 12 and a drill string 14 comprised of multiple sections of drill pipe 16 and other downhole tools 16. Referring now to FIG. 2, and still generally to FIG. 1, drilling pipe 16a, 16b, or other downhole tools 16a, 16b, may include a pin end 100 and a box end 102 to connect the drill pipes 16a, 16b or tools 16a, 16b together. In certain embodiments, a pin end 100 may include an external threaded portion that screws into an internal threaded portion of the box end 102. When threading a pin end 100 into a corresponding box end 102, various shoulders may engage one another to provide structural support to the tool joint.

For example, in some types of drill pipe 16, a pin end 100 may include a primary shoulder 104 and a secondary shoulder 106. Likewise, the box end 102 may include a corresponding primary shoulder 108 and secondary shoulder 110. Drill pipe 16 that includes both a primary and secondary shoulder is often called "double shouldered" pipe. A primary shoulder 104, 108 may be labeled as such to indicate that the primary shoulder 104, 108 provides the majority of the structural support to the joint between sections of drill pipe 16 or downhole tools 16. Nevertheless, a secondary shoulder 106 may also engage a corresponding secondary shoulder 110 in the box end 102, providing additional support or strength to drill pipes 16 or components 16 connected in series. The drill string 14 is typically rotated by the drill rig 10 to turn a drill bit 20 that is loaded against the earth 19 to form a borehole 11. Rotation of the drill bit 20 may alternately be provided by other downhole tools such as drill motors, or drill turbines (not shown) located adjacent to the drill bit 20.

A bottom-hole assembly 21 may include a drill bit 20, sensors, and other downhole tools such as logging-while-drilling ("LWD") tools, measurement-while-drilling ("MWD") tools, diagnostic-while-drilling ("DWD") tools, or the like. Other downhole tools may include heavyweight drill pipe, drill collar, stabilizers, hole openers, sub-assemblies, under-reamers, rotary steerable systems, drilling jars, drilling shock absorbers, and the like, which are all well known in the drilling industry.

While drilling, a drilling fluid is typically supplied under pressure at the drill rig 10 through the drill string 14. The drilling fluid typically flows in a direction 15 downhole through the central bore of the drill string 14 and then returns in an opposite direction uphole to the drill rig 10 through the annulus 11. Pressurized drilling fluid is circulated around the drill bit 20 to provide a flushing action to carry cuttings to the surface.

Figure 3:
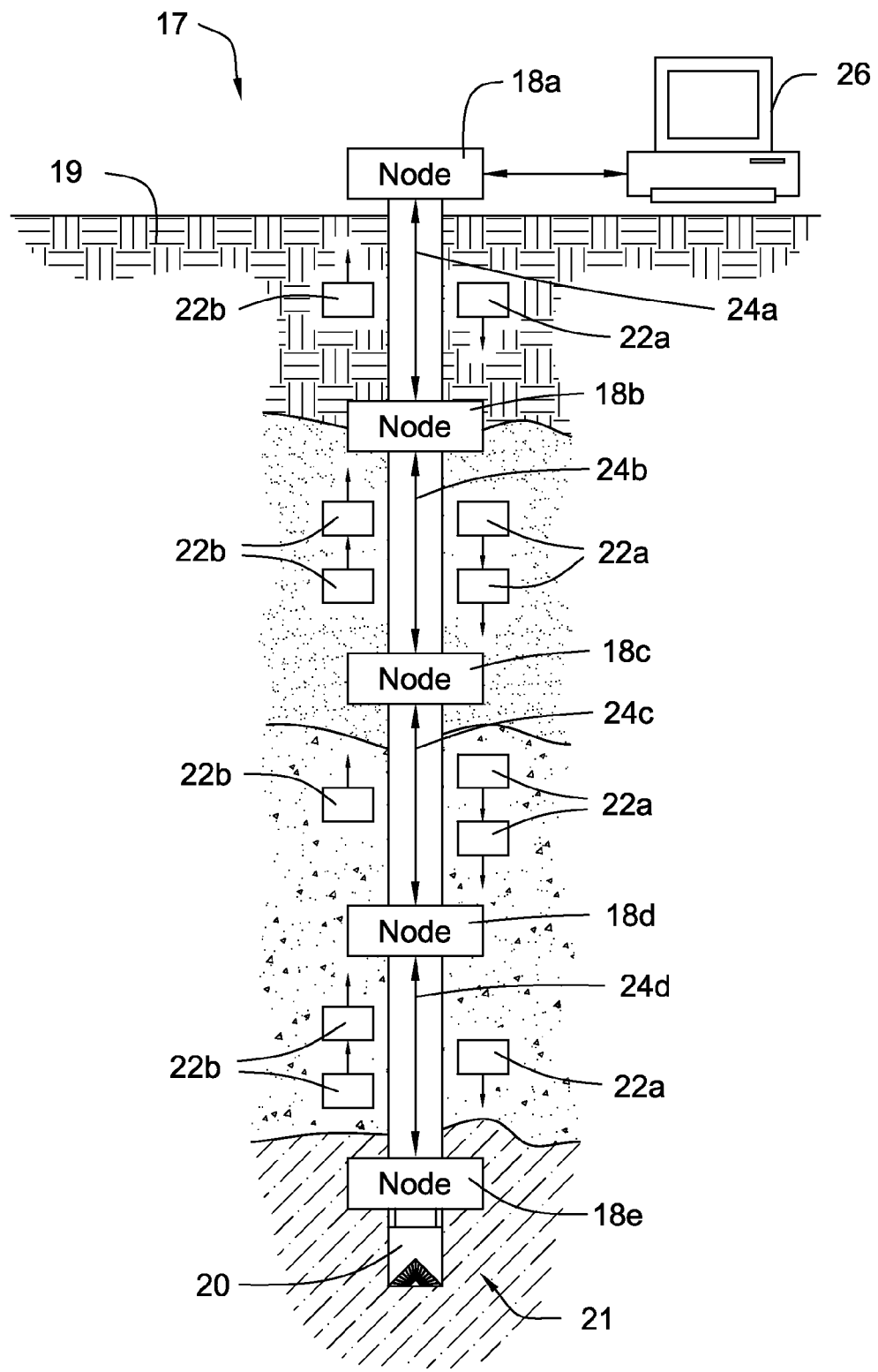
FIG. 3 is a schematic block diagram illustrating one embodiment of a downhole network in accordance with the invention, integrated into the drill string.

Referring to FIG. 3, while continuing to refer generally to FIG. 1, in selected embodiments, a downhole network 17 may be used to transmit information along the drill string 14. The downhole network 17 may include multiple nodes 18a-e spaced at desired intervals along the drill string 14. The nodes 18a-e may be intelligent computing devices 18a-e, such as routers, or may be less intelligent connection devices, such as hubs, switches, repeaters, or the like, located along the length of the network 17. Each of the nodes 18 may or may not have a network address. A node 18e may be located at or near the bottom hole assembly 21. The bottom hole assembly 21 may include a drill bit 20, drill collar, and other downhole tools and sensors designed to gather data, perform various functions, or the like.

Other intermediate nodes 18b-d may be located or spaced along the network 17 to act as relay points for signals traveling along the network 17 and to interface to various tools or sensors located along the length of the drill string 14. Likewise, a top-hole node 18a may be positioned at the top or proximate the top of the drill string 14 to interface to an analysis device 26, such as a personal computer 26.

Communication links 24a-d may be used to connect the nodes 18a-e to one another. The communication links 24a-d may consist of cables or other transmission media integrated directly into the tools 16 making up the drill string 14, routed through the central bore of the drill string 14, or routed external to the drill string 14. Likewise, in certain embodiments, the communication links 24a-d may be wireless connections. In selected embodiments, the downhole network 17 may function as a packet-switched or circuit-switched network 17.

To transmit data along the drill string 14, packets 22a, 22b may be transmitted between the nodes 18a-e. Some packets 22b may carry data gathered by downhole tools or sensors to uphole nodes 18a, or may carry protocols or data necessary to the function of the network 17. Likewise, other packets 22a may be transmitted from uphole nodes 18a to downhole nodes 18b-e. For example, these packets 22a may be used to carry control signals or programming data from a top-hole node 18a to downhole tools or sensors and to downhole nodes 18b-e. Thus, a downhole network 17 may provide a high-speed means for transmitting data and information between downhole components and devices located at or near the earth's surface 19.

Figure 4:
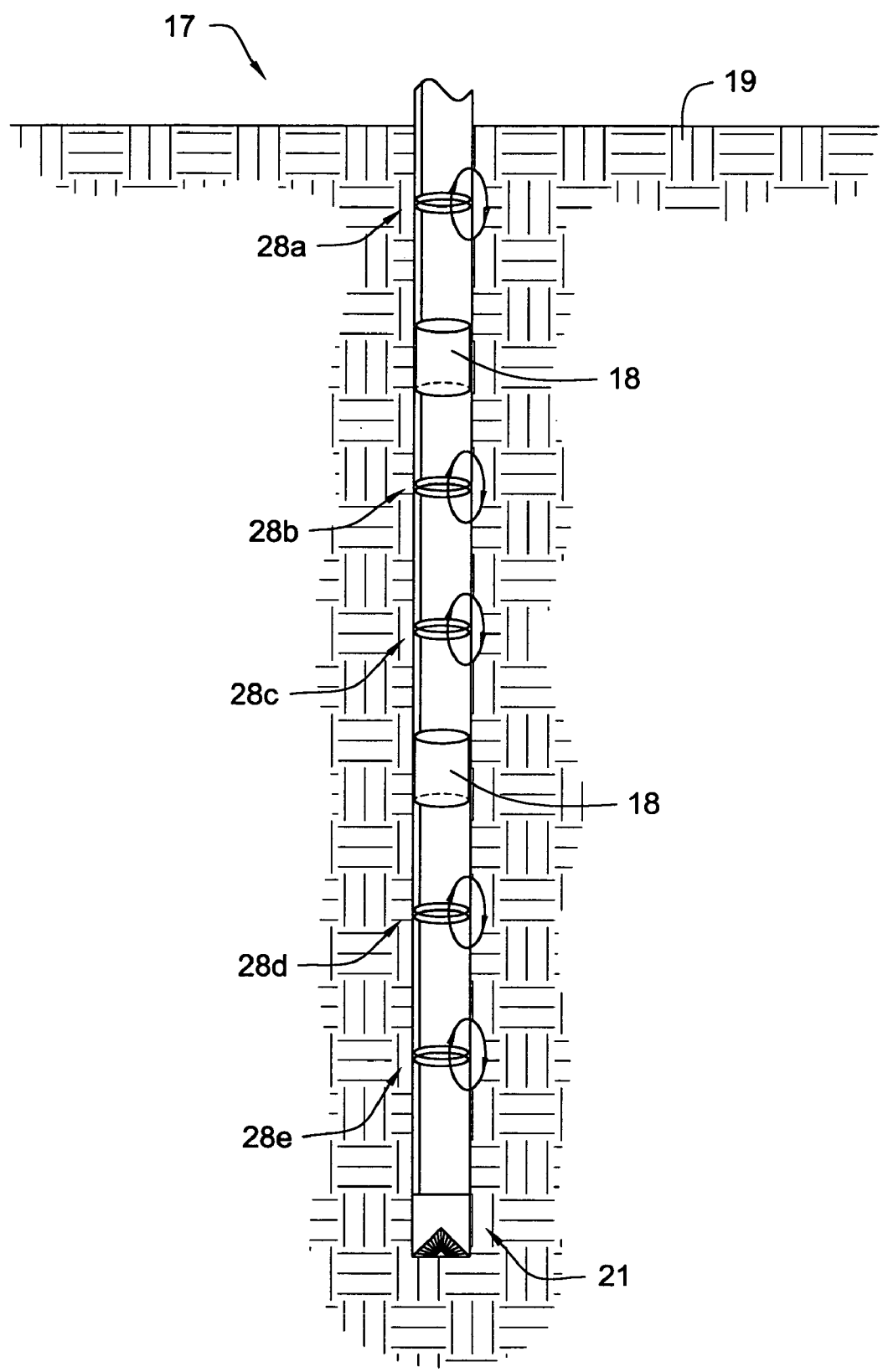
FIG. 4 is a schematic block diagram illustrating one method of transmitting data along a drill string.

Referring to FIG. 4, in one embodiment, a downhole network 17 in accordance with the invention may include various nodes 18 spaced at selected intervals along the drill string 14. Each of the nodes 18 may communicate with a bottom-hole assembly 21. As data travels along the network 17, transmission elements 28a-e may be used to transmit data across the tool joints. For information regarding one embodiment of suitable transmission elements 28a-e and other downhole components, the reader is referred to U.S. Pat. No. 6,670,880 to Hall ("Hall"), incorporated herein by reference.

In Hall, inductive coils are used to transmit data signals across the tool joints. As described therein, a first inductive coil converts an electrical current to a magnetic field that is communicated across the tool joint. A second inductive coil detects the magnetic field and converts the magnetic field back to an electrical current. This allows a data signal to be transmitted across a tool joint even absent a reliable electrical connection. Nevertheless, in other embodiments, the transmission elements 28a-e may also transmit data across the tool joint through direct contact.

Figure 5:
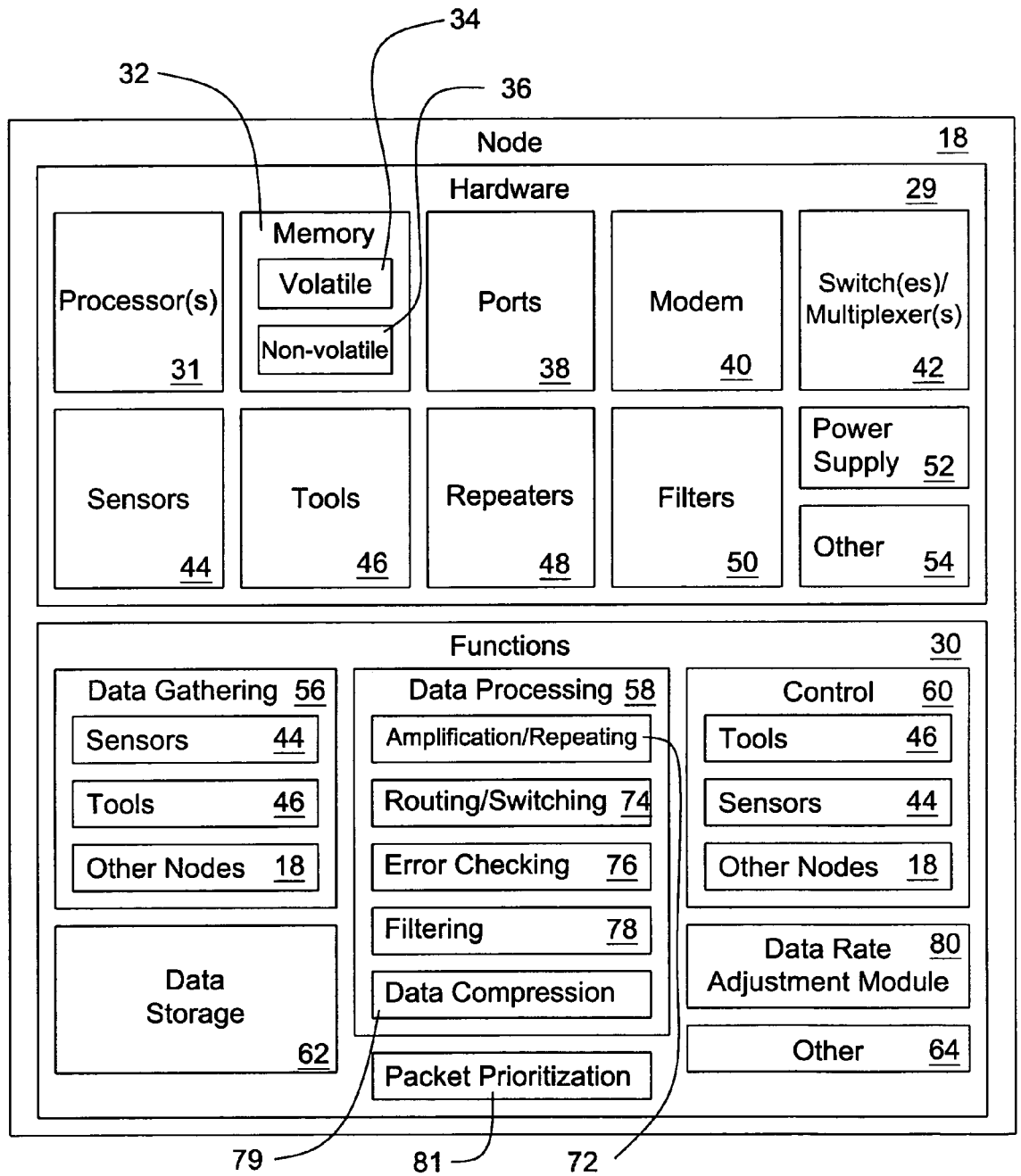
FIG. 5 is a schematic block diagram illustrating various types of hardware and software modules that may be included in a network node in accordance with the present invention.

Referring to FIG. 5, a network node 18 in accordance with the invention may include a combination of hardware 29 and software providing various functions 30. The functions 30 may be provided strictly by the hardware 29, software executable on the hardware 29, or a combination thereof. For example, hardware 29 may include one or several processors 31 capable of processing data as well as executing instructions. The processor 31 or processors 31 may include hardware 29 such as busses, clocks, cache, or other supporting hardware.

Likewise, the hardware 29 may include volatile 34 and non-volatile 36 memories 32 to store data and provide staging areas for data transmitted between hardware components 29. Volatile memory 34 may include random access memory (RAM), or equivalents thereof, providing high-speed memory storage. Memory 32 may also include selected types of non-volatile memory 36 such as read-only-memory (ROM), PROM, EEPROM, or the like, or other long-term storage devices, such as hard drives, floppy disks, flash memory, or the like. Ports 38 such as serial ports, parallel ports, or the like, may be used to interface to other devices connected to the node 18, such as sensors or tools located proximate the node 18.

A modem 40 may be used to modulate digital data onto an analog carrier signal for transmission over network cable or other transmission media, and likewise, demodulate the analog signals when received. A modem 40 may include various built in features including but not limited to error checking, data compression, or the like. In addition, the modem 40 may use any suitable modulation type such as ASK, PSK, QPSK, OOK, PCM, FSK, QAM, PAM, PPM, PDM, PWM, or the like, to name a few. The choice of a modulation type may depend on a desired data transmission speed, the bandwidth capability of the network hardware, as well as unique operating conditions that may exist in a downhole environment. Likewise, the modem 40 may be configured to operate in full-duplex, half-duplex, or other mode. The modem 40 may also use any of numerous networking protocols currently available, such as collision-based protocols like Ethernet, token-based, or asynchronous transfer (ATM) protocols.

A node 18 may also include one or several switches 42, multiplexers 42, or both. A switch 42 may filter, forward, and route traffic on the network. Multiplexers 42 (and corresponding demultiplexers 42) may transmit multiple signals over a single communications line or a single channel. The multiplexers 42 may use any known protocol to transmit information over the network 17, including but not limited to frequency-division multiplexing, time-division multiplexing, statistical time-division multiplexing, wave-division multiplexing, code-division multiplexing, spread spectrum multiplexing, or combinations thereof.

A node 18 may also include various downhole tools 46 and sensors 44. These tools 46 and sensors 44 may be integrated into the node 18 (i.e., share the same circuitry) or interface to the node 18 through ports 38. Tools 46 and sensors 44 may include devices such as coring tools, mud logging devices, pore fluid sensors, resistivity sensors, induction sensors, sonic devices, radioactivity sensors, electrical potential tools, temperature sensors, accelerometers, imaging devices, seismic devices, mechanical devices such as caliper tools or free point indicators, pressure sensors, inclinometers, surveying tools, navigation tools, or the like. These tools 46 and sensors 44 may be configured to gather data for analysis uphole, and may also receive data such as control signals, programming data, or the like, from uphole sources. For example, control signals originating at the surface may direct a sensor 44 to take a desired measurement. Likewise, selected tools 46 and sensors 44 may be re-programmed through the network 17 without extracting the tools from the borehole.

A drill string 14 may extend into the earth 20,000 feet or more. As a result, signal loss or attenuation may be a significant factor when transmitting data along the downhole network 17. This signal loss or attenuation may vary according to the network hardware. The reader is referred to the Hall patent for a description of one embodiment of various hardware components that may be used to construct the network 17. For example, a drill string 14 is typically comprised of multiple segments of drill pipe 16 or other drill tools 16. As a result, signal loss may occur each time a signal is transmitted from one downhole tool 16 to another 16. Since a drill string may include several hundred sections of drill pipe 16 or other tools 16, the aggregate attenuation can be significant. Likewise, attenuation may also occur in the cable or other transmission media routed along the drill string 14.

To compensate for signal attenuation, amplifiers 48, or repeaters 48, may be spaced at selected intervals along the network 17. The amplifiers 48 may receive a data signal, amplify it, and transmit it to the next node 18. Like amplifiers 48, repeaters 48 may be used to receive a data signal and retransmit it at higher power. However, unlike amplifiers 48, repeaters 48 may remove noise from the data signal. This may be done by demodulating the data from the transmitted signal and re-modulating it onto a new carrier.

Likewise, a node 18 may include various filters 50. Filters 50 may be used to filter out undesired noise, frequencies, and the like that may be present or introduced into a data signal traveling up or down the network 17. Likewise, the node 18 may include a power supply 52 to supply power to any or all of the hardware 29. The node 18 may also include other hardware 54, as needed, to provide other desired functionality to the node 18.

The node 18 may provide various functions 30 that are implemented by software, hardware, or a combination thereof. For example, the node's functions 30 may include data gathering 56, data processing 58, control 60, data storage 62, or other functions 64. Data may be gathered 56 from sensors 44 located downhole, tools 46, or other nodes 18 in communication with a selected node 18. This data 56 may be transmitted or encapsulated within data packets transmitted up and down the network 17.

Likewise, the node 18 may provide various data processing functions 58. For example, data processing may include data amplification 72 or repeating 72, routing 74 or switching 74 data packets transmitted along the network 17, error checking 76 of data packets transmitted along the network 17, filtering 78 of data, as well as data compression 79 and decompression 79. Likewise, a node 18 may process various control signals 60 transmitted from the surface to tools 46, sensors 44, or other nodes 18 located downhole. A node 18 may store data that has been gathered from tools 46, sensors 44, or other nodes 18 within the network 17. Similarly, the node 18 may include other functions 64, as needed.

In selected embodiments, a node 18 may include a data rate adjustment module 80. The data rate adjustment module 80 may monitor network traffic traveling in both uphole and downhole directions. The data rate adjustment module 80 may optimize the network's settings and efficiency by adjusting the allocation of bandwidth for data traveling uphole and downhole. As is typical in most communication systems, data rates may be limited by the available bandwidth of a particular system. For example, in downhole drilling systems, available bandwidth may be limited by the transmission cable, hardware used to communicate across tool joints, electronic hardware in the nodes 18, the downhole environment, or the like. Thus, the data rate adjustment module 80 may efficiently allocate the limited available bandwidth where it is most needed.

For example, in selected embodiments, most of the network traffic may flow from downhole tools 46 and sensors 44 to the surface for analysis. Thus, ordinarily, most of the network bandwidth may be allocated to traffic traveling uphole. Nevertheless, in some circumstances, more bandwidth may be needed for traffic traveling downhole. For example, in some cases, significant downhole bandwidth may be needed when reprogramming downhole tools 46 and sensors 44, or when sending large amounts of control data downhole. In these instances, the data rate adjustment module 80 may adjust the bandwidth to provide additional bandwidth to downhole traffic. In some instances, this may include reducing the allocated bandwidth for uphole traffic. Likewise, when the need for additional downhole bandwidth has abated, the data rate adjustment module 80 may readjust the available bandwidth by re-allocating bandwidth to uphole traffic.

In certain embodiments, the node 18 may include hardware or software to prioritize packets 81. Because various tools and sensors connected to the nodes 18 may gather many diverse types of data, such as pressure, temperature, seismic data, inclination, azimuth, salinity, or other data, to name a few, certain types of data may be more time sensitive, important, or have greater priority for any number of possible reasons. As such, it may be desirable that certain types of data reach the surface before other types of data in situations where data or packets are competing for bandwidth. In such cases, a node 18 may be configured to give priority to certain types of information or data packets.

For example, in selected embodiments, a node 18 may be configured to provide various "qualities of service" to different types of data or packets traveling through the network 17. In selected embodiments, the network 17 may be configured to reserve certain resources along the route from source to destination, such as bandwidth, channels, or the like, for certain types of data. In this way, certain types of data may be transmitted in "real time" while others types data may experience some delay.

In certain embodiments, priority tags may be added to a packet to indicate the data's priority. The nodes 18 may parse these priority tags to determine which data or packets are to be given priority over the network 17. In other embodiments, information may be added to the packet that indicates the packet's age. For example, an older packet may indicate that the packet has experienced delay or other congestion within the network. As such, an older packet may be given priority over younger packets as it is transmitted through the network 17. As the packet passes from node 18 to node 18 in the network 17, each node 18 may adjust the age of the packet to account for delay incurred as the packet passes through the node 18.

Figure 6:
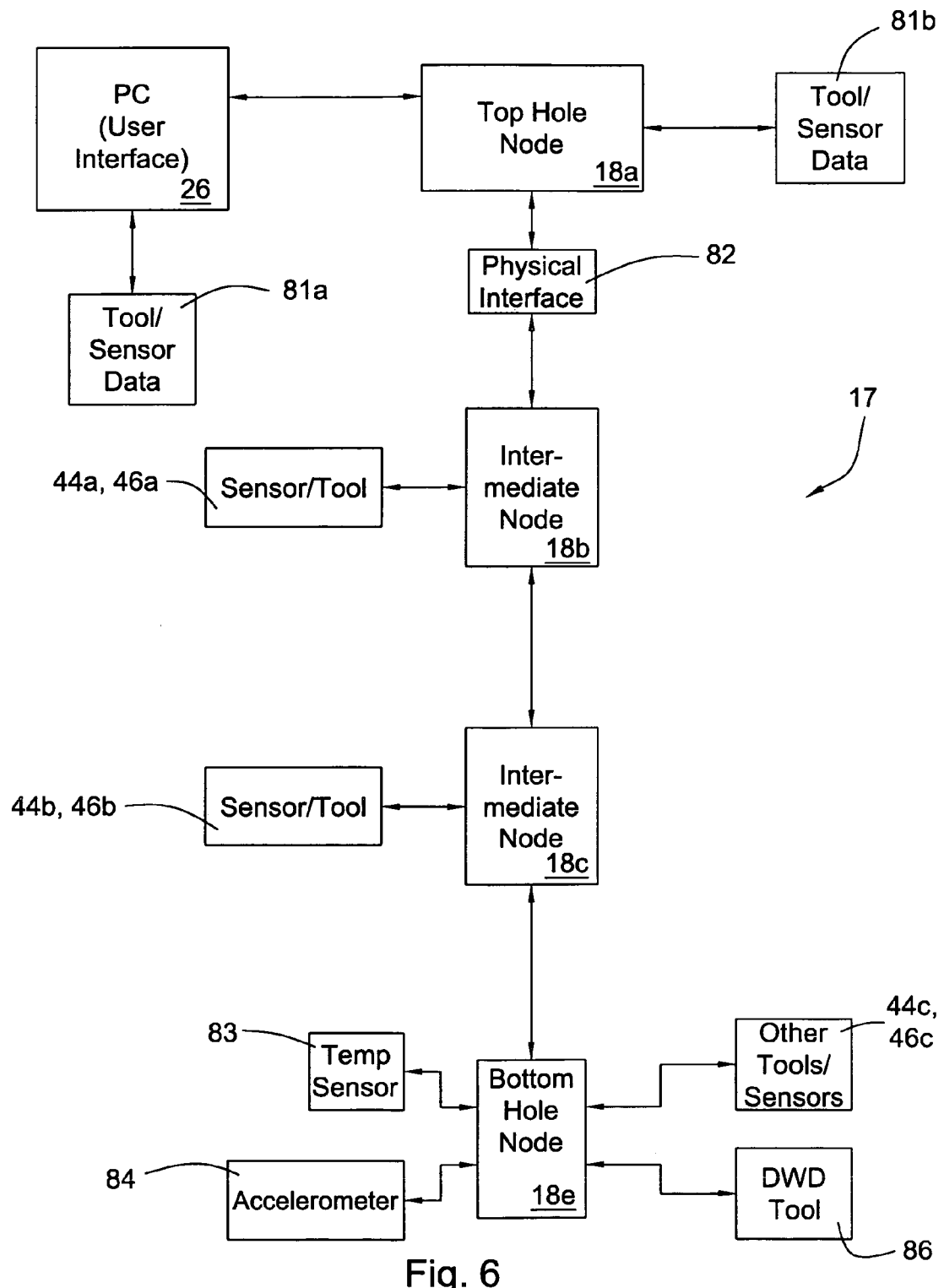
FIG. 6 is a high-level schematic block diagram illustrating one embodiment of a downhole network in accordance with the invention.

Referring to FIG. 6, in one embodiment, a downhole network 17 in accordance with the invention may include a top-hole node 18a and a bottom-hole node 18e. A bottom-hole node 18e may interface to various components located in or proximate a bottom-hole assembly 21. For example, a bottom-hole node 18e may interface to a temperature sensor 83, an accelerometer 84, a DWD (diagnostic-while-drilling) tool 86, or other tools 46c or sensors 44c such as those listed in the description of FIG. 4.

A bottom-hole node 18e may communicate with an intermediate node 18c located at an intermediate point along the drill string 14. The intermediate node 18c may also provide an interface to tools 46b or sensors 44b, such as seismic devices, communicating through the network 17. Likewise, other nodes 18, such as a second intermediate node 18b, may be located along the drill string 14 to communicate with other sensors 44a or tools 46a. Any number of intermediate nodes 18b, 18c may be used along the network 17 between the top-hole node 18a and the bottom-hole node 18e.

In selected embodiments, a physical interface 82 may be provided to connect network components to a drill string 14. For example, since data may be transmitted directly up the drill string on cables or other transmission media integrated directly into drill pipe 16 or other drill string components 16, the physical interface 82 may provide a physical connection to the drill string so data may be routed off of the drill string 14 to network components, such as a top-hole node 18a, or personal computer 26.

For example, a top-hole node 18a may be operably connected to the physical interface 82. The top-hole node 18a may also be connected to an analysis device 26 such as a personal computer 26. The personal computer 26 may be used to analyze or examine data gathered from various downhole tools 46 or sensors 44. Likewise, tool and sensor data 81a may be saved or output from the analysis device 26. Likewise, in other embodiments, tool and sensor data 81b may be routed directly off the top-hole node 18a for analysis.

Figure 7:
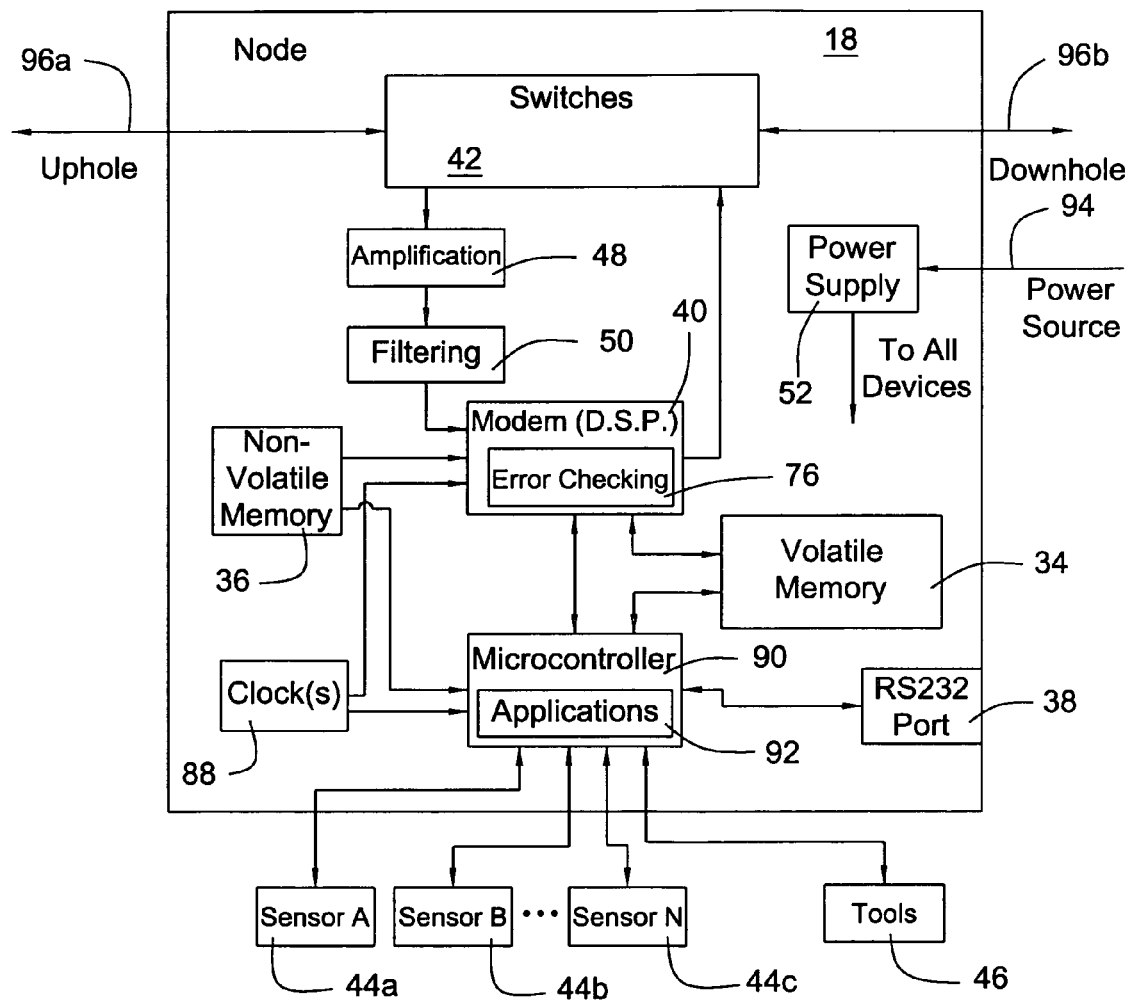
FIG. 7 is a more detailed schematic block diagram illustrating one embodiment of hardware and software components that may be included in a network node in accordance with the invention.

Referring to FIG. 7, in selected embodiments, a node 18 may include various components to provide desired functionality. For example switches 42, multiplexers 42, or a combination thereof may be used to receive, switch, and multiplex or demultiplex signals, received from other uphole 96a and downhole 96b nodes 18. The switches/multiplexers 42 may direct traffic such as data packets or other signals into and out of the node 18, and may ensure that the packets or signals are transmitted at proper time intervals, frequencies, or combinations thereof.

In certain embodiments, the multiplexer 42 may transmit several signals simultaneously on different carrier frequencies. In other embodiments, the multiplexer 42 may coordinate the time-division multiplexing of several signals. Signals or packets received by the switch/multiplexer 42 may be amplified 48 and filtered 50, such as to remove noise. In certain embodiments received signals may simply be amplified 48. In other embodiments, the signals may be received, data may be demodulated therefrom and stored, and the data may be remodulated and retransmitted on a selected carrier frequency having greater signal strength. A modem 40 may be used to demodulate digital data from signals received from the switch/multiplexer and modulate digital data onto carrier signals for transfer to the switches/multiplexer for transmission uphole or downhole.

The modem 40 may also perform various tasks such as error-checking 76 and data compression. The modem 40 may also communicate with a microcontroller 90. The microcontroller 90 may execute any of numerous applications 92. For example, the microcontroller 90 may run applications 92 whose primary function is to acquire data from one or a plurality of sensors 44a-c. For example, the microcontroller 90 may interface to sensors 44 such as inclinometers, thermocouplers, accelerometers, imaging devices, seismic data gathering devices, or other sensors such as those listed in the description of FIG. 4. Thus, the node 18 may include circuitry that functions as a data acquisition tool.

In other embodiments, the microcontroller 90 may run applications 92 that may control various tools 46 or sensors 44 located downhole. That is, not only may the node 18 be used as a repeater, and as a data gathering device, but it may also be used to receive or provide control signals to control selected tools 46 and sensors 44, as needed. The node 18 may also include a volatile memory device 34, such as a FIFO 34 or RAM 34, that may be used to store data needed by or transferred between the modem 40 and the microcontroller 90.

Other components of the node 18 may include non-volatile memory 36, which may be used to store data, such as configuration settings, node addresses, system settings, and the like. One or several clocks 88 may be provided to provide clock signals to the modem 40, the microcontroller 90, or any other device. A power supply 52 may receive power from an external or internal power source 94, as discussed in more detail with reference to FIGS. 10-14, below. The power supply 52 may provide power to any or all of the components located within the node 18. Likewise, an RS232 port 38 may be used to provide a serial connection to the node 18.

Thus, a node 18, as more generally described in FIG. 5, may provide many more functions than those supplied by a simple signal repeater. The node 18 may provide many of the advantages of an addressable node on a local area network. The addressable node 18 may amplify signals received from uphole 96a or downhole 96b sources, be used as a point of data acquisition, and be used to provide control signals to desired sensors 44 or tools 46. These represent only a few examples of the versatility of the node 18. Thus, the node 18, although useful and functional as a repeater, may have a greatly expanded capability.

Apparatus and methods may be implemented to transceive information between nodes 18 along a string of connected drill pipes 16 or other components 16. One major issue, however, is the transmission of information across joints where a pin end 100 connects to a box end 102. Again referring generally to FIG. 2, in selected embodiments, a transmission element 112a may be mounted proximate a mating surface 106 or shoulder 106 on a pin end 100 to communicate information to another transmission element 112b located on a mating surface 110 or shoulder 110 of the box end 102. Cables 114a, 114b, or other transmission media 114a, 114b, may be operably connected to the transmission elements 112a, 112b to transmit information along the downhole tools 16a, 16b.

In certain embodiments, an annular recess may be provided in the secondary shoulder 106 of the pin end 100 and in the secondary shoulder 110 of the box end 102 to house each of the transmission elements 112a, 112b. The transmission elements 112a, 112b may have an annular shape and be mounted around the radius of the shoulders 106, 110. Since a secondary shoulder 106 may contact or come very close to a secondary shoulder 110 of a box end 102, a transmission element 112a may sit substantially flush with the secondary shoulder 106 on the pin end 100. Likewise, a transmission element 112b may sit substantially flush with the surface of the secondary shoulder 110 of the box end 102.

In selected embodiments, a transmission element 112a may transmit data to a corresponding transmission element 112b through direct electrical contact therewith. In other embodiments, the transmission element 112a may convert an electrical signal to a magnetic field or magnetic current. A corresponding transmission element 112b, located proximate the transmission element 112a, may detect the magnetic field or current. The magnetic field may induce an electrical current in the transmission element 112b. This electrical current may then be transmitted from the transmission element 112b by way of an electrical cable 114b routed along the drill pipe 16b or downhole component 16b.

Figure 8:
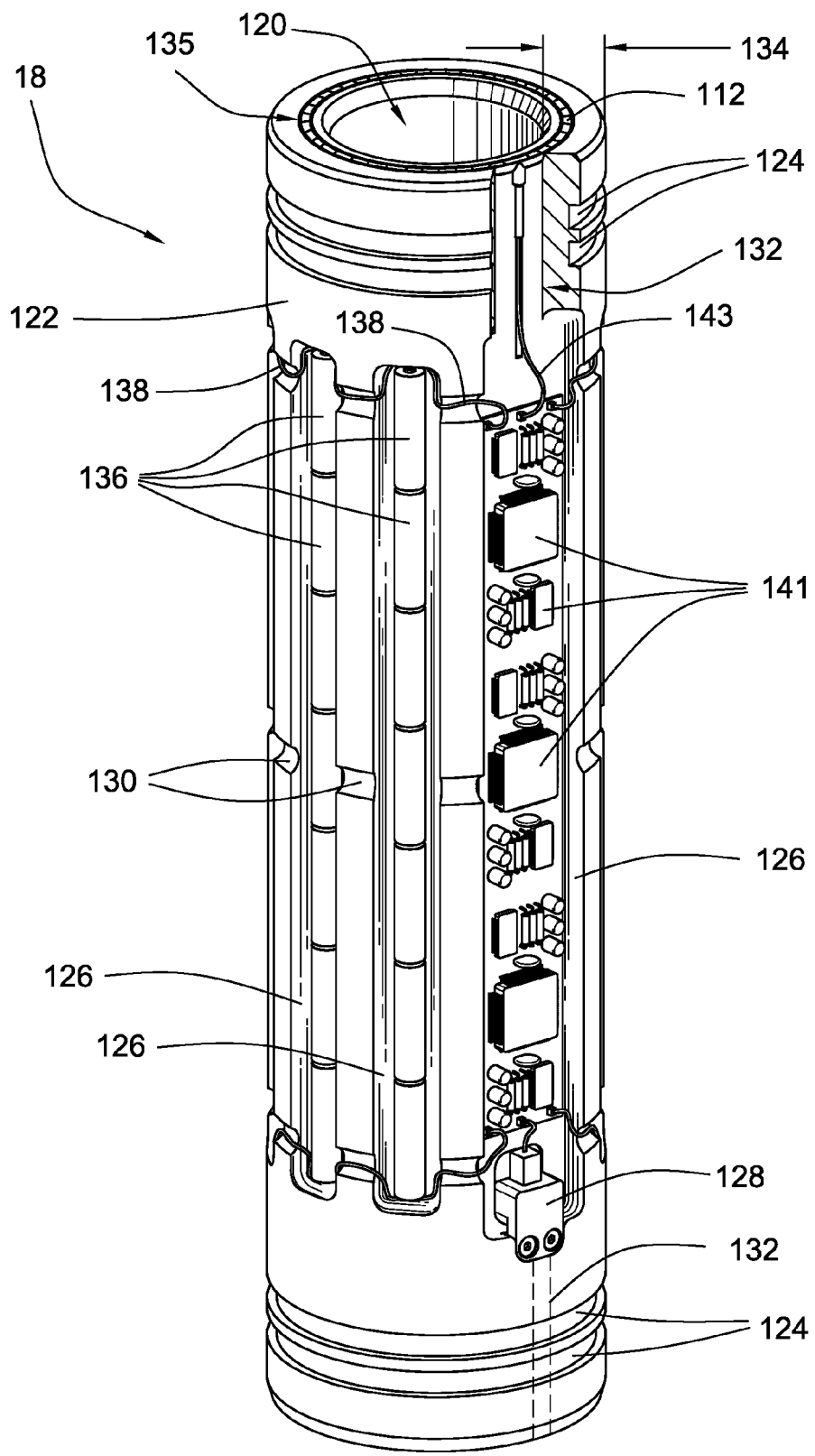
FIG. 8 is a perspective view of a perspective view of one embodiment of a network node in accordance with the invention.

Referring to FIG. 8, in certain embodiments, a node 18 may include a cylindrical housing 122 defining a central bore 120. The cylindrical housing 122 may be substantially circular. The central bore 120 may have a diameter that is slightly smaller than the inner bore diameter of a typical section of drill pipe 16 to accommodate and provide space to components of the node 18.

Nevertheless, in selected embodiments, as batteries and electronic components become more compact, it is feasible that the central bore 120 of the node 18 could be substantially equal to that normally encountered in sections of drill pipe 16 or other downhole tools 16. The node 18 may be configured for insertion into a host downhole tool 16. Thus, the node 18 may be removed or inserted as needed to access or service components located therein.

In selected embodiments, the node 18 may include one or several grooves 124 or seal contact surfaces 124 to seal the node 18 within a host downhole tool 16. Seals inserted into the seal contact surfaces 124 or grooves 124 may prevent fluids such as drilling mud, lubricants, oil, water, and the like from contaminating circuitry or components inside the node 18. Moreover, the entry of other substances such as dirt, rocks, gasses, and the like, may also be prevented.

In selected embodiments, the node 18 may include one or several recesses 126a-c to house various components contained in the node 18. Selected recesses 126c may contain node circuitry 141 as well as downhole tools 46 and sensors 44, such as seismic devices, that may fit in the recess 126c. Other recesses 126a, 126b may be used for batteries 136 or other components. One or several channels 130 may be milled or formed in the cylindrical housing 122 to provide for the routing of wires between recesses 126a c. In selected embodiments, a connector 128 may be used to connect node circuitry 141, tools 46, and sensors 44 to a cable, wire, or other link, traveling up or down the drill string 14.

As illustrated, the node 18 may be characterized by a general wall thickness 134. Likewise, in regions proximate recesses 126 or other channels 130, a thinner wall thickness may be present. Nevertheless, a critical wall thickness should be maintained to provide structural reliability to the node 18 to support stresses encountered in a downhole environment. The cylindrical housing 122 may be constructed of any suitable material including steel, aluminum, plastics, and the like, capable of withstanding the pressures, stresses, temperatures, and abrasive nature of a downhole environment.

As illustrated, one or several transmission paths 132 may be milled or formed into the wall of the node 18 to provide an outlet for cables, wires, or other transmission media exiting the recess 126c. In selected embodiments, a connector 128 may be provided to simply link up with or connect to node circuitry 141, or in other embodiments, a channel 132a may enable the routing of cables, wires, and the like from the node circuitry 141 to a transmission element 112. A transmission element 112 may be provided in an annular recess 135 milled or otherwise formed into the end of the cylindrical housing 122.

As illustrated, a node 18 is equipped with components or circuitry 141 needed to provide functionality to the node 18. For example, batteries 136 connected in series or parallel may be inserted into selected recesses 126 of the node 18. Wires 138 may be routed through channels 130 interconnecting the recesses 126 to connect the batteries 136 together, or to connect the batteries 136 to node circuitry 141.

Likewise, node circuitry 141, or components 141, may be located within other recesses 126c. As was previously stated, a conductor 143, cable 143, or other transmission media 143, may travel from the node circuitry 141 to a transmission element 112. The transmission element 112 may transmit energy to another transmission element in contact therewith. The transmission element 112 may have an annular shape and may transmit energy by direct electrical contact, or may convert an electrical current to a magnetic field. The magnetic field may then be detected by another transmission element in close proximity thereto located on a subsequent downhole tool 16.

Figure 9:
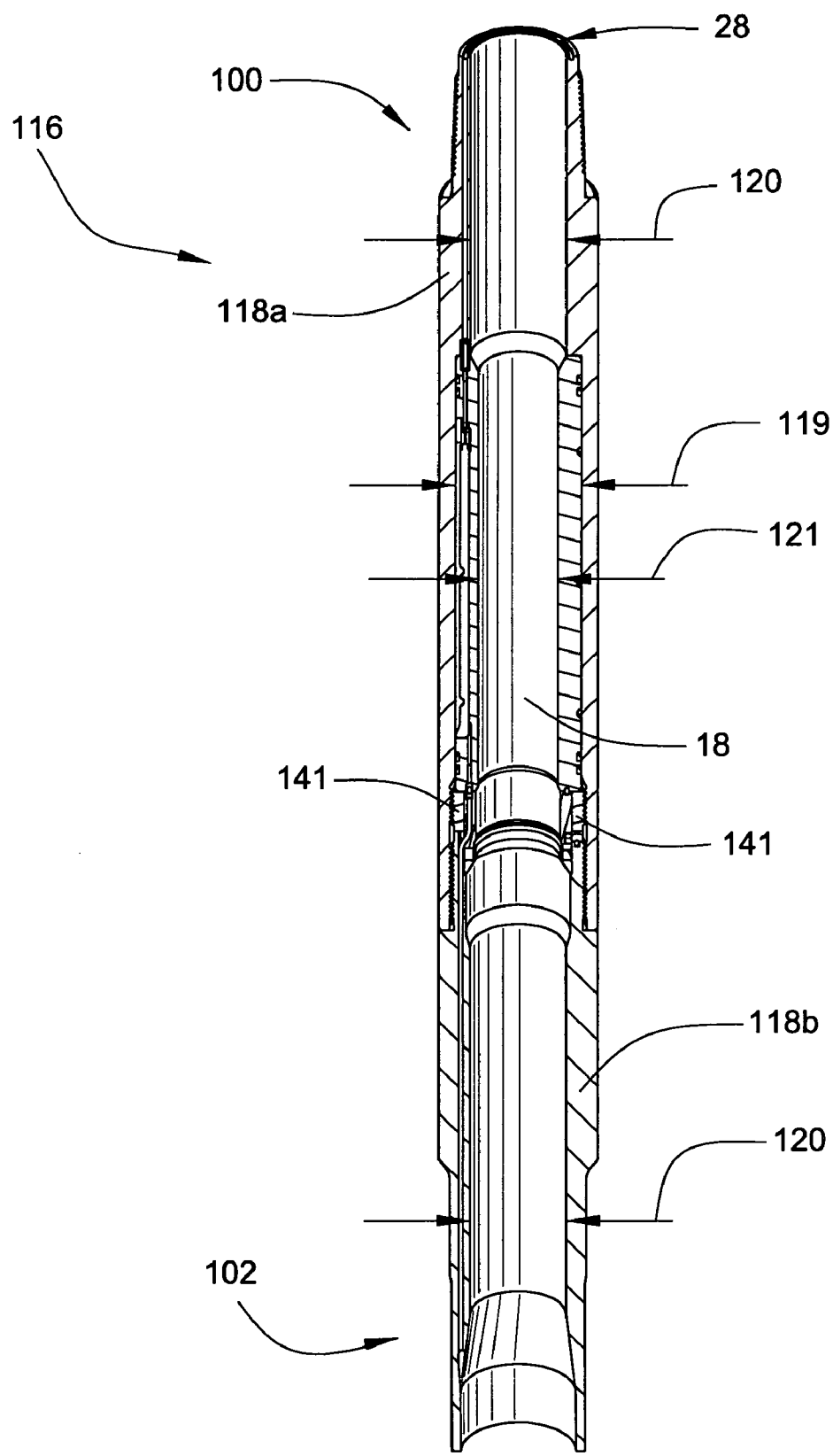
FIG. 9 is a cross-sectional view illustrating one embodiment of a downhole tool adapted to receive a network node in accordance with the invention.

Referring to FIG. 9, in selected embodiments, a downhole tool 16 or several downhole tools 16 may be adapted to accommodate the node 18 illustrated in FIG. 8. This may allow nodes 18 to be distributed at desired intervals along a drill string 14.

For example, in selected embodiments, a node 18 may be inserted into a host downhole tool 116 modified to receive the node 18. This host tool 116 may include a threaded portion, such as a box end 102, to receive the pin end 100 of another downhole tool 16. An oversize bore 119 may be provided in a portion 118a of a downhole tool 16 to accommodate the node 18, which may have a narrowed bore 121 smaller than the standard central bore 120, but sufficient to accommodate the flow of mud or other drilling fluids therethrough. Nevertheless, as electronic circuitry, batteries, and the like become smaller and more compact, the diameter of the narrow bore 121 will more closely approximate the diameter of the standard central bore 120. A transmission line may be used carry data up and down the drill string 14 from the node 18. Because the node 18 fits inside the inside diameter of the host downhole tool 116, the node's components, including node circuitry 141 and batteries 136, may be protected from the downhole environment.

Figure 10:
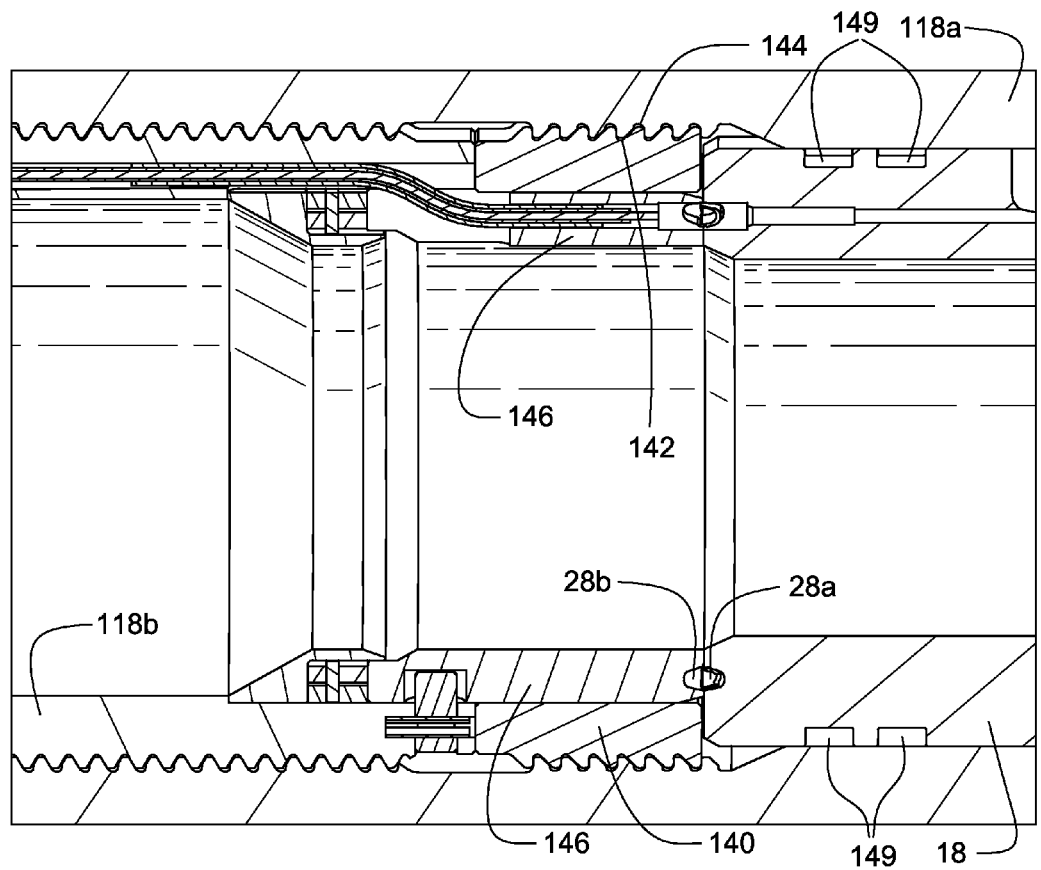
FIG. 10 is cross-sectional perspective view of a tool joint adapted to receive a network node in accordance with the present invention.

Referring now to FIGS. 9 and 10, one embodiment of a node 18 housed within a host downhole tool 116 may comprise a secondary shoulder insert 140 that may be inserted into a portion 118a of the host tool 116 to absorb joint stress. Indeed, drill pipe 16 suitable for use with a node 18 typically includes a pin end 100 that threads into a corresponding box end 102 of another downhole tool 16. Normally, a primary shoulder on a pin end 104 mates to a corresponding primary shoulder on the box end 108. Likewise, a secondary shoulder on the pin end 106 mates to a corresponding secondary shoulder on the box end 110.

Although a primary shoulder may absorb the majority of the joint stress between two interconnected downhole tools, stress absorbed by the secondary shoulder is significant to the strength of the joint. Thus, when threading a first portion 118a of a host downhole tool 116 into a second portion 118b, the structure 118a, 118b should provide at least as much strength as is provided by a normal pin end and box end connection.

As illustrated, the portion 118a lacks a secondary shoulder to enable insertion of the node 18 into the bore 120. Thus, in selected embodiments, a secondary shoulder insert 140 may be inserted into the portion 118a to absorb stress normally incident on a secondary shoulder. In addition, since the insert 140 absorbs stress normally incident on the secondary shoulder, pressure may be relieved from the node 18.

As shown in FIG. 10, external threads of the pipe section 118b may thread into internal threads of the other pipe section 118a. Because of the lack of a natural secondary shoulder, a secondary shoulder insert 140 may include grooves or threads 142 to engage corresponding grooves 144 formed in the internal diameter of the section 118a. Thus, the secondary shoulder insert 140 may provide a quasi-secondary shoulder, but may also be removed to allow insertion and removal of the node 18 from the pipe section 118a.

A transmission interface 146 may fit within the inside diameter of the secondary shoulder insert 140 and be pressed firmly against the node 18 to provide effective signal coupling therefrom. For example, the node 18 may include an annular transmission element 28a. The transmission interface 146 may also include an annular transmission element 28b in close proximity to the transmission element 28a to provide efficient signal coupling therebetween.

Various seals 149 in grooves or recesses of the node 18 may seal against the inside diameter of the pipe section 118a to prevent contamination of sensitive components.

Figure 11:
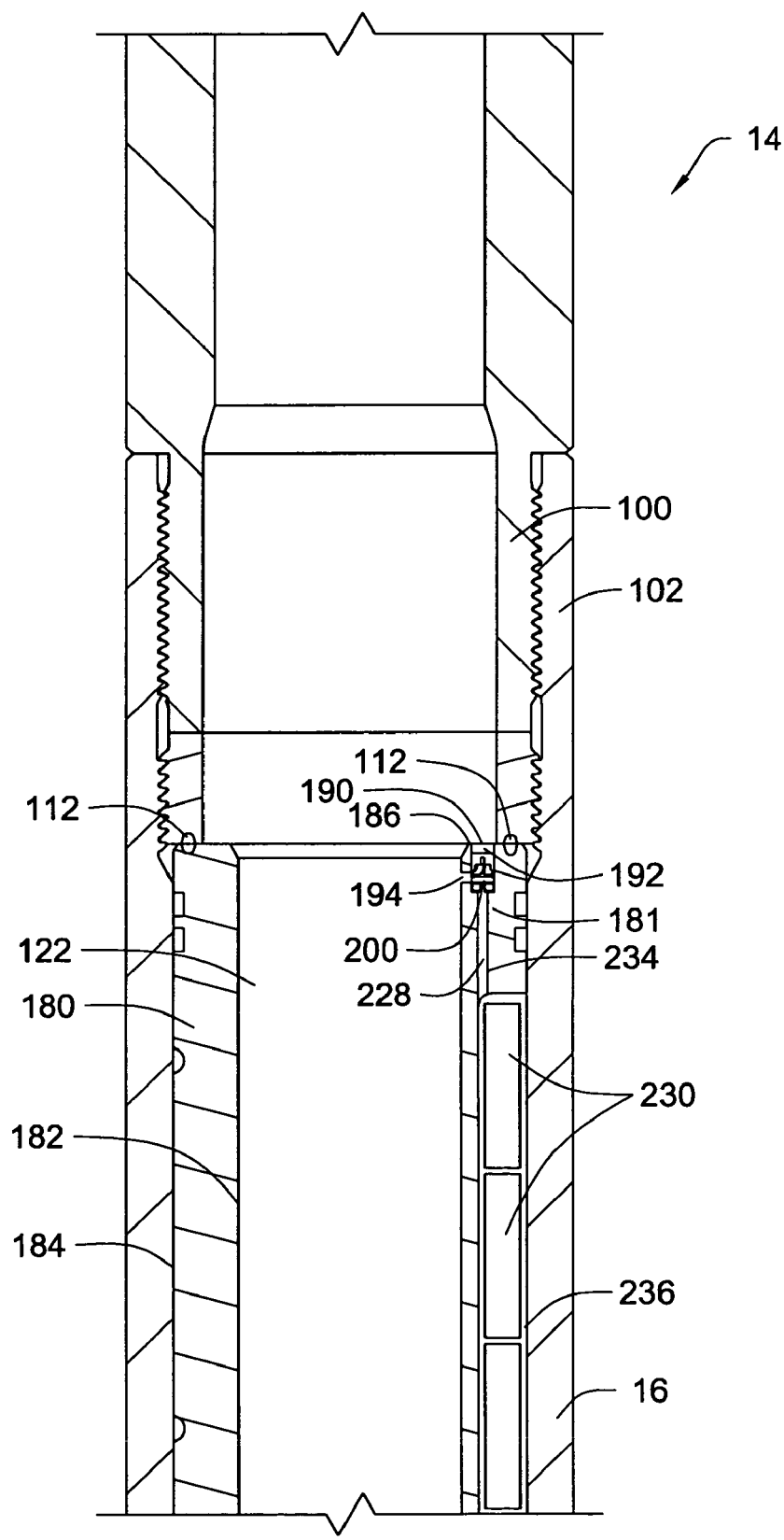
FIG. 11 is a cross-sectional view of a tool joint adapted to receive a cylindrical unit incorporating a generator assembly.

A reliable and efficient power supply is critical to node function, and may be adapted to power other devices and/or tools. Referring generally to FIGS. 11-14, each of which depicts an alternative embodiment of a power supply in accordance with the present invention, a power supply 52 may comprise an internal downhole electrical generator assembly 200 adapted to reside within a wall 181 of a substantially cylindrical unit 180. A substantially cylindrical unit 180 may comprise a node 18, downhole tool 16, drill pipe 16, pipe insert member (not shown), or other structure known to those in the art. In certain embodiments, as shown in FIG. 11 and in an alternative embodiment in FIG. 12, a substantially cylindrical unit 180 is a modular unit adapted to be received within the central bore 120 of a downhole tool 16, drill pipe 16, or other segment of drill string 14. The cylindrical unit 180 may be adapted to be integrated into the box end 102 of a downhole tool 16 or drill pipe 16 by way of complementary threads, or by any other means known to those in the art. A cylindrical unit 180 preferably comprises an internal diameter just less than the internal diameter of the box end 102 such that the substantially cylindrical unit 180 may be quickly and easily implemented in connection with existing drill string components without obstructing the central bore 120 thereof.

Figure 13:
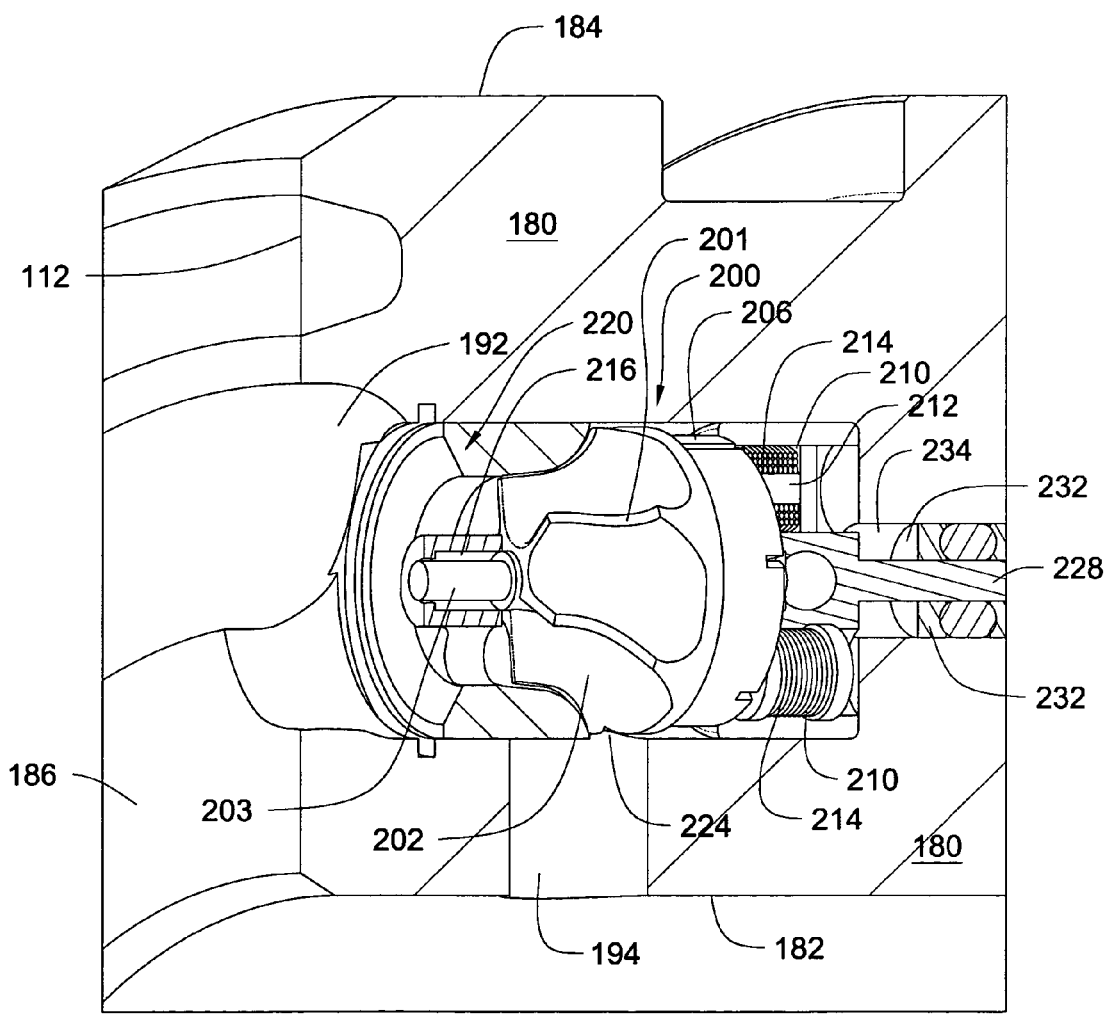
FIG. 13 is a perspective view of a downhole electrical generator in accordance with certain embodiments of the present invention.

An internal downhole electrical generator assembly 200 in accordance with the present invention may comprise several individual components, as discussed in detail with reference to FIGS. 13 and 14 below, where each component of the assembly 200 comprises dimensions capable of being retained within a wall 181 of the cylindrical unit 180. The unique placement of the downhole electrical generator assembly 200 within a wall 181 of the cylindrical unit 180 enables an unobstructed flow of drilling fluid through the central bore 120 of the drill string 14 while providing a continuous, reliable source of energy to downhole components.

Specifically, a downhole electrical generator assembly 200 in accordance with the present invention may be adapted to generate electricity in response to a flow of drilling fluid. As discussed with reference to FIG. 1 above, pressurized drilling fluid flows through a central bore 120 of the drill string 14 to lubricate moving parts, as well as to flush cuttings to the surface. A hollow passageway 190 may be milled into the wall 181 of the cylindrical unit 180 to enable a flow of drilling fluid therethrough. The hollow passageway 190 may comprise dimensions sufficient to accommodate the components of the downhole electrical generator assembly 200 disclosed herein.

A hollow passageway 190 may comprise an inlet 192 and an outlet 194. In certain embodiments, the dimensions of the inlet 192 and/or outlet 194 may be selectively adjusted according to electrical output requirements of the downhole electrical generator assembly 200. Alternatively, in some embodiments, as discussed in more detail with reference to FIG. 14 below, a regulating element 240 may be implemented within the passageway 190 to regulate a flow of fluid therethrough.

The hollow passageway 190 may enable a flow of drilling fluid from an inner surface 182 of the wall 181 to an outer surface 184 thereof, or from a first point on the inner surface 182 to a second point on the inner surface 182. Alternatively, the hollow passageway 190 may enable a flow of drilling fluid between an end 186 of the wall 181 and an inner surface 182. In certain embodiments, the flow of drilling fluid is routed so as not to compromise the hydraulic integrity of the drill string 14. The hollow passageway 190 thus extends between a first point on an inner surface 182 of the wall and a second point on the inner surface 182, or between an end 186 and a point on the inner surface 182.

In certain embodiments, the central bore 120 of the cylindrical unit 180 may be constricted at an area substantially corresponding to the hollow passageway 190 to promote a stream of drilling fluid from the inlet 192 to the outlet 194. Alternatively, a stream of drilling fluid may be directed through the hollow passageway 190 by selectively constricting the central bore 120 at an alternate position, by valves, a suction device, passive flow, or by any other method or device known to those in the art. According to certain embodiments of the present invention, as discussed in more detail with reference to FIG. 14 below, a high pressure differential between the inlet 192 and the outlet 194 may direct the flow of drilling fluid.

Figure 12:
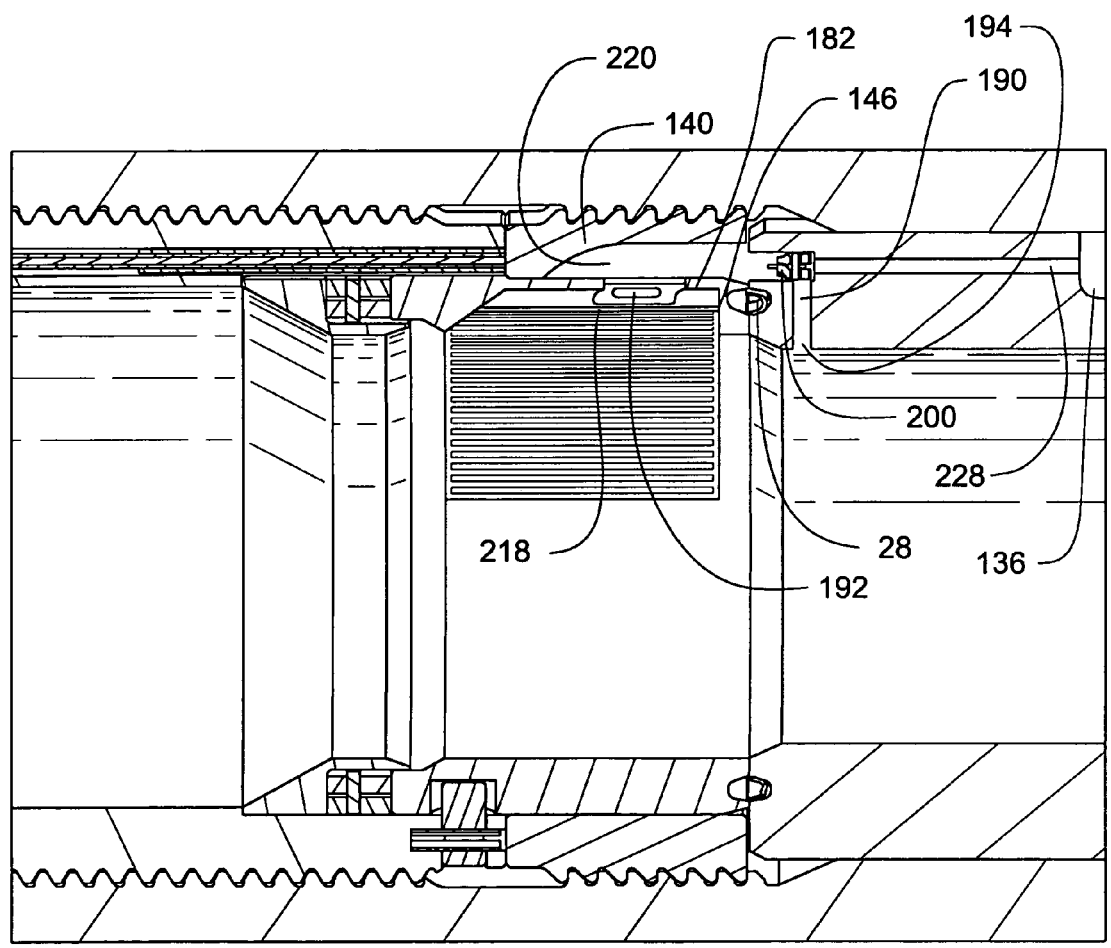
FIG. 12 is an enlarged cross-sectional view of an alternative embodiment of the tool joint and generator assembly of FIG. 11.

Referring now to FIG. 12, a filter 218 may be implemented to cover the inlet 192 of the hollow passageway 190 to filter the stream of drilling fluid to exclude large particles and debris that may become lodged within the hollow passageway 190 or that may otherwise damage the downhole electrical generator assembly 200 or other sensitive components. In certain embodiments, the filter 218 may comprise a diameter substantially corresponding to the inlet 192 and be implemented directly over the inlet 192. Alternatively, the filter 218 may comprise a surface area substantially greater than a diameter corresponding to the inlet 192 so as to facilitate self-cleaning of the filter 218. A filter 218 may comprise, for example, a Thompson filter, such as that disclosed in U.S. Pat. No. 5,132,013, or any other filter known to those in the art.

In other embodiments of the present invention that implement a node 18 having a secondary shoulder insert 140, as discussed above with reference to FIGS. 9 and 10, a filter 218 may be implemented along an inner surface 182 of a transmission interface 146 such that a flow of fluid is drawn through a void 220 created between the transmission interface 146 and the secondary shoulder insert 140 into the inlet 192. According to this embodiment, the flow of fluid is substantially passive, where the combination of the void 220 and the inlet 192 communicating with the void 220 draws fluid into the hollow passageway 190 and through the generator 200. In other embodiments, the dimensions of the central bore 120 may be altered to facilitate a venturi effect with respect to the passageway 190. Alternatively, a suction device or other device or method known to those in the art may be implemented to draw a flow of fluid from the inlet 192 to an outlet 194 located on an inner surface 182 of the node 18 or other cylindrical unit 180.

The filter 218 of the embodiment depicted by FIG. 12 may occupy an entire internal diameter of the transmission interface 146, or any portion thereof. Preferably, filter 218 dimensions are substantially greater than inlet 192 dimensions to facilitate self-cleaning of the filter 218 and thereby prevent clogs at the inlet 192. A void 220 between the secondary shoulder insert 140 and a surface of the transmission interface 146 may correspond to the filter 218 dimensions, or any portion thereof.

In any case, the direction of the flow of drilling fluid through the passageway 190 actuates the downhole electrical generator assembly 200 secured therein. Specifically, as illustrated in the embodiments of the invention depicted by FIGS. 13 and 14, the pressure of drilling fluid through the inlet 192 is converted to velocity by guide vanes 201 on the turbine 202, causing the turbine 202 to rotate. A turbine 202 in accordance with the present may comprise a Kaplan turbine, a Pelton turbine, a Turgo turbine, a Francis turbine, a Pelton turbine, a cross-flow turbine, or any other type of turbine known to those in the art. In certain embodiments, a turbine 202 comprises more than one set of guide vanes 201, where the sets of guide vanes 201 are longitudinally spaced by a shaft 203 and, optionally, straightening vanes (not shown).

A turbine 202 may comprise steel, tungsten, diamond, carbide, or any other natural or synthetic material known to those in the art capable of resisting extreme temperatures, pressures, abrasives and wear downhole. In certain embodiments, a turbine 202 comprises steel coated with a natural or synthetic resin such as tungsten, diamond or carbide. Bearings 216 allowing rotational movement of the turbine 202 may also comprise carbide, diamond, or any other material known to those in the art capable of withstanding extreme downhole conditions.

The turbine 202 may be directly coupled to a generator, or may be operatively connected to the generator by any means or methods known to those in the art. A generator may comprise a rotor 206 and a stator 210. Preferably, a rotor 206 comprises a plurality of permanent magnets 208 affixed thereto. The stator 210 comprises coils 214 circumscribing a core 212 to create an electromagnet. The stator 210 may be secured substantially adjacent the rotor 206 such that rotation of the rotor 206 causes a flux in the magnetic field of the stator 210 to generate electricity.

A stator core 212 preferably comprises soft ferrite having a pot core geometry. This geometry is designed to contain substantially all of the magnetic flux generated from the interaction between the rotor 206 and stator 210. Alternatively, the core 212 may comprise an alternate closed magnetic path core geometry or any other core geometry known to those in the art.

A transformer 226 may communicate with stator coils 214 to produce either direct or alternating electrical current. The electrical current so generated may be transmitted to a storage receptacle 230 or internal mechanical or electrical device via a conductor 228 connected to the generator assembly 200.

In certain embodiments, a conductor 228 may reside within a recess 234 adjoining the hollow passageway 190 and a pocket 236 housing a battery or other storage receptacle 230 or mechanical or electrical device. Seals 232 may occupy a space between the conductor 228 and recess 234 to isolate the conductor 228, thereby promoting efficient transmission of electricity to the intended target.

Figure 14:
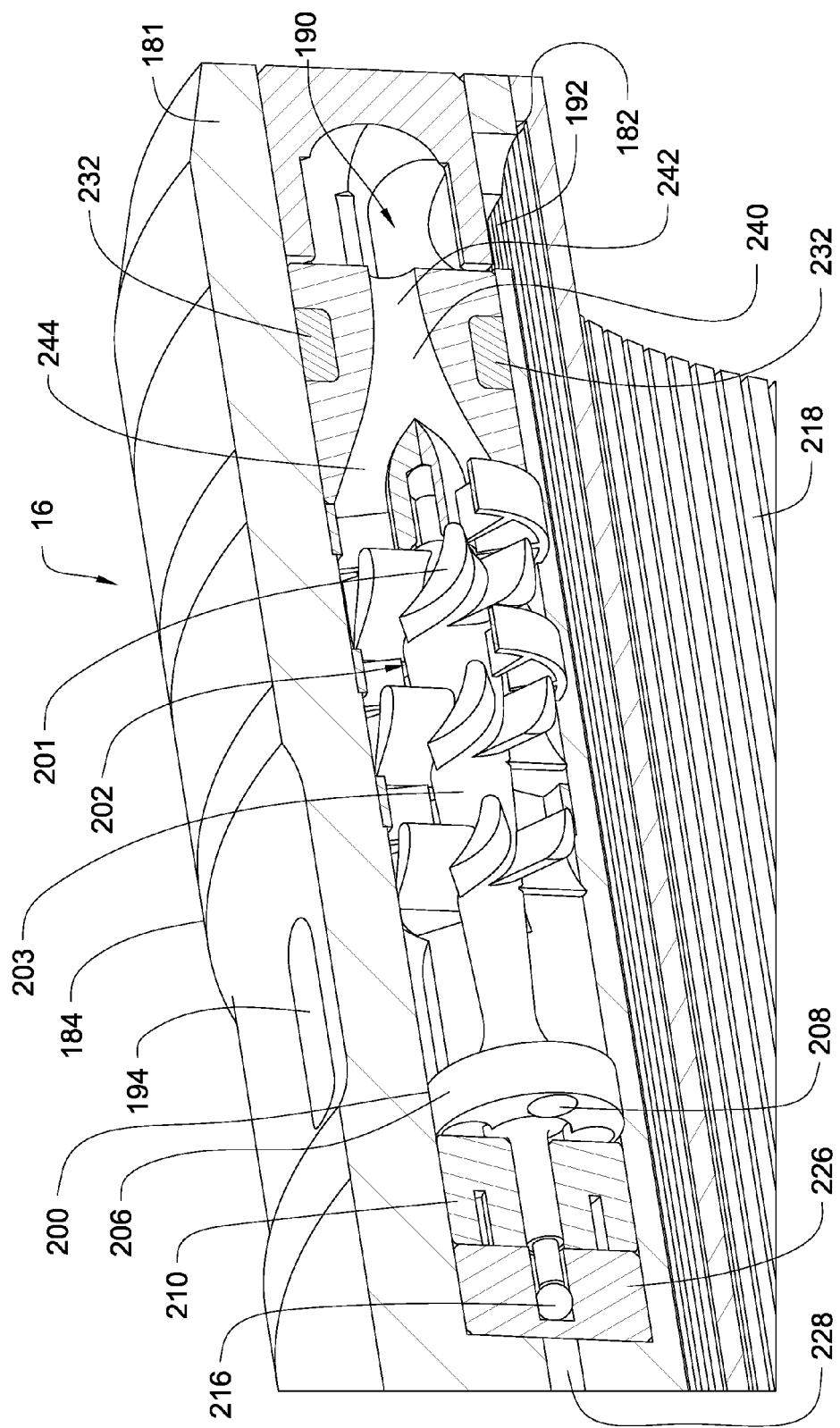
FIG. 14 is a cross-sectional perspective view of an alternate downhole electrical generator implemented in a downhole tool, where the generator is driven by a high pressure differential.

Referring to FIG. 14, in some embodiments, an inlet 192 may draw fluid from the inner surface 182 of the wall 181 to an outlet 194 on the outer surface 184 of the wall 181, thereby creating a high pressure differential to drive the generator assembly 200 with increased efficiency. In certain embodiments, a high pressure differential may comprise, for example, the difference between an internal pressure as great as 4,000 psi and an external pressure close to 0 psi. In selected embodiments, a regulating element 240 may be implemented within the hollow passageway 190 to regulate the rate of fluid flow where there is a high pressure differential between the inlet 192 and the outlet 194.

A regulating element 240 may comprise, for example, a substantially conical aperture having an intake opening 242 and an exit opening 244, where a diameter corresponding to the intake opening 242 is substantially less than a diameter corresponding to the exit opening 244. The diameter of the intake opening 242 may be selected according to a desired rate of flow through the generator 200. In this manner, the rate of flow through the generator 200 may be selectively slowed and maintained substantially constant despite a high pressure differential between the inlet 192 and the outlet 194. A regulating element 240 may be sealed within the hollow passageway by way of seals 232, and may comprise steel, tungsten, diamond, carbide, a combination thereof, or any other material known to those in the art capable of withstanding extreme downhole conditions. In selected embodiments, a regulating element 240 may be coated with tungsten, diamond, carbide, or a combination thereof.

As illustrated in FIG. 14, a flow of fluid may traverse the filter 218 from the central bore 120 of a downhole tool 16, facilitated by a high internal versus external pressure differential. An inlet 192 may draw the fluid into the hollow passageway 190 and through the regulating element 240. The small diameter intake opening 242 may regulate the flow of fluid to achieve a desired rate of flow and energy output. The fluid may then proceed through the turbine 202 to actuate the generator assembly 200, thereby producing usable energy. The flow of fluid may then exit the generator assembly 200 and hollow passageway 190 through the outlet 194, which traverses an outer surface 184 of the wall 181 of the downhole tool 16.

In other embodiments, a generator assembly 200 responsive to a high pressure differential may be incorporated within a wall 181 of a node 18 or other cylindrical unit 180. A cylindrical unit 180 may comprise for example, the filter 218, hollow passageway 190, regulating element 240, turbine 202, and generator assembly 200 of FIG. 14. The outlet 194, however, may traverse the outer surface 184 of the wall 181 of a cylindrical unit 180 and may communicate with the annulus 11 through a wall of a downhole tool 16 in which the cylindrical unit 180 resides.

Specifically, in selected embodiments of a downhole tool 16, an opening is provided at a location substantially corresponding to the outlet 194 of the cylindrical unit 180. The opening may function to accommodate a pressure gauge to monitor pressures and other conditions downhole, or may perform any other function known to those in the art. According to certain embodiments of the present invention, however, the opening may serve a dual purpose in both accommodating the pressure gauge or performing another function, and routing a flow of fluid through the outlet 194 and a wall of a host downhole tool 116. In this manner, a pressure differential between the annulus 11 and the central bore 120 drives a flow of fluid to generate electricity. Seals may seal space between the cylindrical unit 180 and the host downhole tool 116 to ensure a direct flow of fluid from the outlet 194 to the annulus 11, through the wall of a host tool 116.

Figure 15:
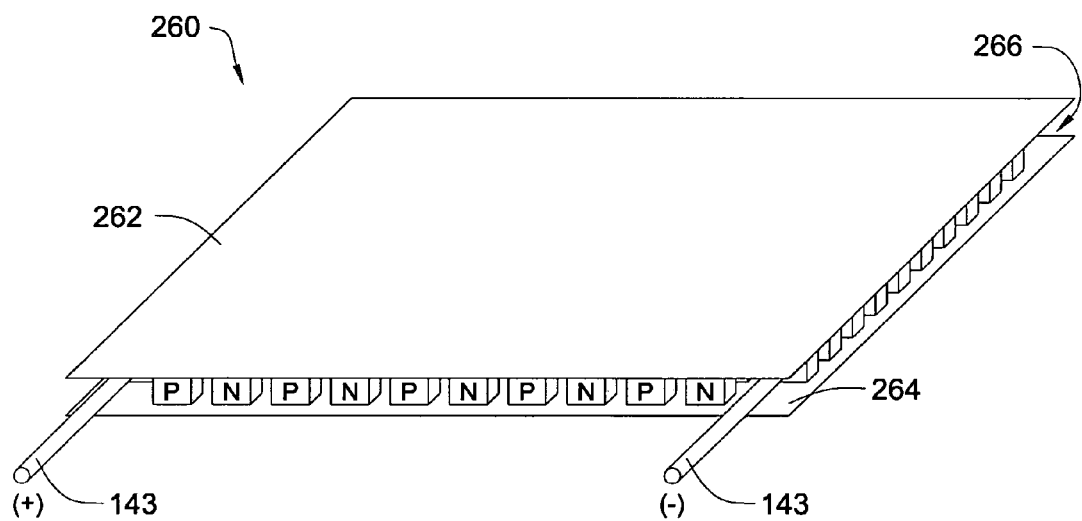
FIG. 15 is a perspective view of one embodiment of a thermoelectric cooling device in accordance with the present invention.

While a downhole generator assembly 200 in accordance with the present invention may facilitate a continuous supply of power to electrical components 141 and node circuitry 141 downhole, continuous and proper functioning of such components 141 depends on proper temperature control as well as protection from other hostile effects downhole. Referring now to FIG. 15, a solid state thermoelectric cooling device 260 may be implemented in connection with sensitive electrical components 141 to regulate component temperatures downhole. In certain embodiments, a thermoelectric cooling device 260 may operate on the Peltier effect, inducing a heating or cooling effect when electric current passes through two dissimilar conductors 143. In one embodiment, a thermoelectric cooling device 260 comprises an array of alternately positively ("p-type") and negatively doped ("n-type") semiconductor elements 266 that act as the two dissimilar conductors. Semiconductor elements 266 in accordance with the present invention may comprise bismuth telluride, or any other material known to those in the art capable of being optimized to pump heat. Semiconductor elements 266 are connected electrically in series and thermally in parallel, and may be sandwiched between first and second sides 262 and 264 of a thermoelectric cooling device 260. First and second sides 262 and 264 of a thermoelectric cooling device 260 may comprise a metallized ceramic substrate or other isolating material known to those in the art.

A power source, such as embodiments of the downhole generator assembly 200 previously discussed with reference to FIGS. 11-14, may be provided to move electrons through the cooling system of the present invention. As a current passes through one or more pairs of the semiconductor elements 266, there is a decrease in temperature at the junction on a first side 262 ("cold side") of the thermoelectric cooling device 260, resulting in absorption of heat from the environment. The heat is carried through the cooling device 260 by electron transport and released on a second side 264 ("hot side") of the thermoelectric cooling device 260 as the electrons move from a high to low energy state. This heat may then be transferred from the thermoelectric cooling device 260 to the environment by a heat sink 274 or similar device, as discussed in more detail with reference to FIGS. 16-20 below. In certain embodiments, a plurality of thermoelectric cooling devices 260 may be combined in series to achieve an increased temperature differential between the first side 262 of an initial cooling device 260 and the second side 264 of a terminal cooling device 260.

A thermoelectric cooling device 260 in accordance with the present invention is advantageous in that it has no moving parts, and is thus virtually maintenance free. It is also smaller and lighter than comparable mechanical cooling systems. Further, the solid-state construction of a thermoelectric cooling device 260 ensures high reliability, which is particularly advantageous in a downhole application that is not easily accessible after installation, while electrical interference from the thermoelectric cooling device 260 is negligible.

Figure 16:
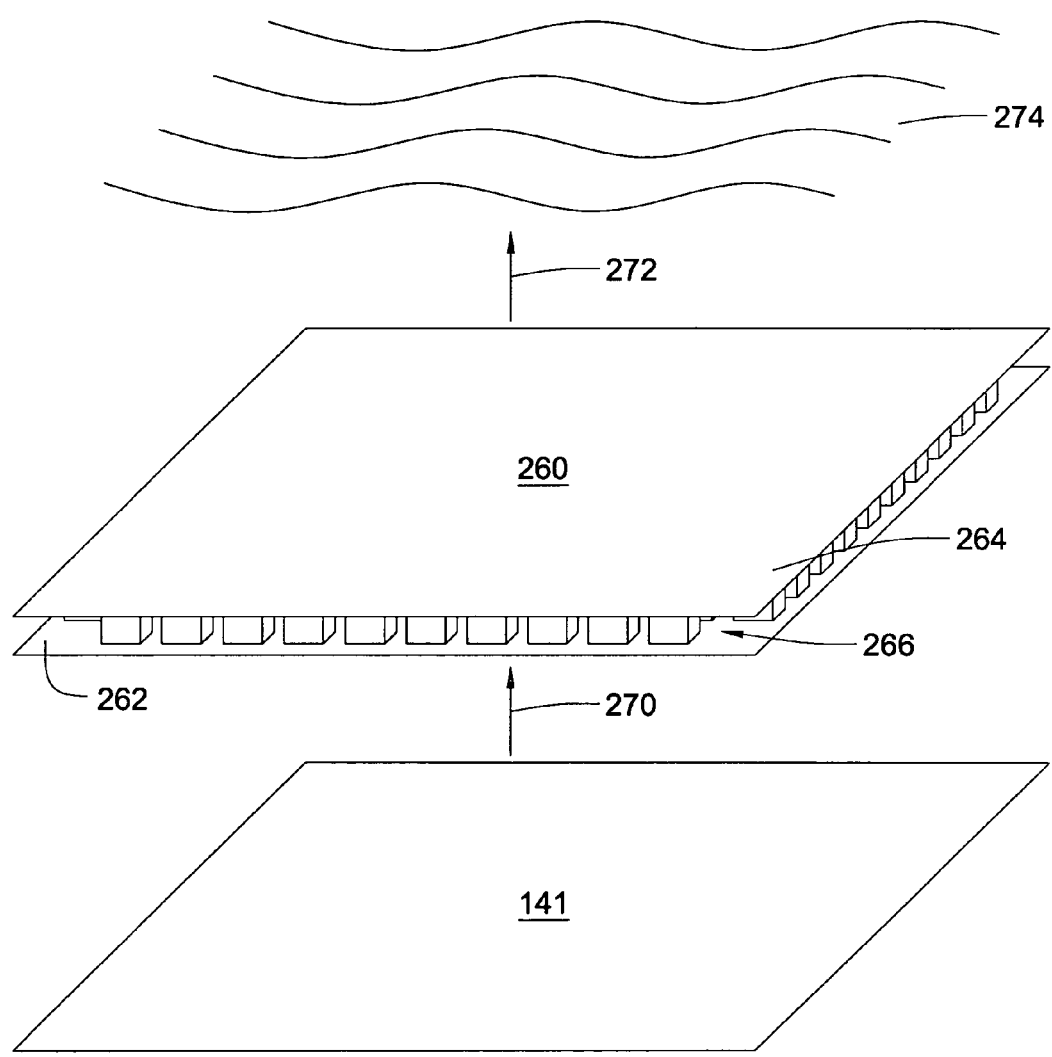
FIG. 16 is a perspective view of an electrical component operationally coupled to a thermoelectric cooling device and heat sink in accordance with the present invention.

Referring now to FIG. 16, the energy efficiency of a thermoelectric cooling device 260 in accordance with the present invention may be expressed as a coefficient of performance. The greater the coefficient of performance, the more efficient the device 260 in extracting and transferring heat. A coefficient of performance is directly affected by the number of heat transfer steps required to extract and transfer heat.

The present invention effectively increases the coefficient of performance of the thermoelectric cooling device 260, and thus limits thermal inefficiencies, by directly coupling the thermoelectric cooling device 260 to each of a heat generating electrical component 141 and a heat sink 274. Specifically, a first side 262 of a thermoelectric cooling device 260 in accordance with the present invention may be directly mounted to an electrical component 141 by soldering, epoxy, compression, or by any other means known to those in the art, such that at least a portion of the first side 262 is directly in contact with the electronic component 141. Preferably, dimensions corresponding to the thermoelectric cooling device 260 are substantially equal to dimensions corresponding to the electrical component 141 to which it is coupled to minimize a risk of condensation while maximizing thermal transfer efficiency. At least a portion of the second side 264 of the thermoelectric cooling device 260 may be physically exposed to and in contact with a heat sink 274, such as a flow of drilling fluid. In this manner, heat from the electrical component 141 may be absorbed at the first side 262 of the thermoelectric cooling device 260 in a first heat transfer step 270, and released to a heat sink 274 from the second side 264 of the thermoelectric cooling device 260 in a second heat transfer step 272.

Figure 17:
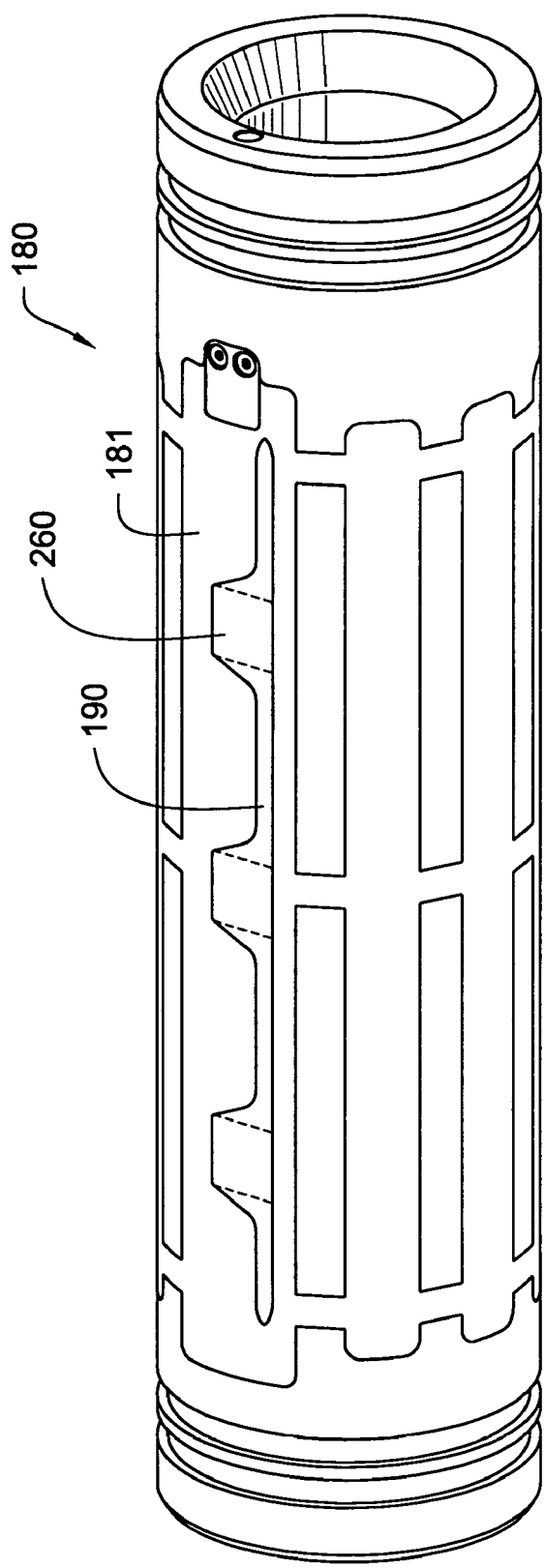
FIG. 17 is a perspective view of a cylindrical unit incorporating a thermoelectric cooling system in accordance with certain embodiments of the present invention.

Referring now to FIG. 17, the present invention enables direct thermal coupling by providing a secure environment for sensitive electrical components 141 that protects such components 141 from hostile effects downhole. Specifically, sensitive electrical components 141 may be housed within a substantially rigid and isolated structure, such as within a wall 181 of a substantially cylindrical unit 180 as previously disclosed. As discussed above, a substantially cylindrical unit 180 in accordance with the present invention may comprise a downhole tool, drill pipe, network node, or other pipe insert member or device known to those in the art. A hollow passageway 190 may be provided in a wall 181 of the cylindrical unit 180 as discussed with reference to embodiments of the downhole generator assembly 200 illustrated in FIGS. 11-14 above, such that the electrical components 141 reside substantially adjacent to the hollow passageway 190 and may be in direct or indirect communication therewith. In certain embodiments, electrical components 141 are substantially embedded within a wall 181 of the cylindrical unit 180 such that only a portion of the components 141 are exposed to the hollow passageway 190. A potting material 280, such as silicon rubber, or any other substantially elastomeric material known to those in the art, may be provided to substantially encapsulate portions of the components 141, thereby further protecting such components 141 against shock, vibration and other harmful effects downhole.

A thermoelectric cooling device 260, as previously disclosed with reference to FIGS. 15 and 16, may be directly coupled to an electrical component 141 and in communication with the hollow passageway 190. In this manner, heat may be dissipated from the electrical component 141 to a heat sink 274 through the thermoelectric cooling device 260. As seen in FIG. 17, in certain embodiments, dimensions of the hollow passageway 190 may vary along a length thereof to enable a greater surface area of the thermoelectric cooling device 260 to come into direct contact with a flow of drilling fluid or other heat sink 274 present in the hollow passageway 190, thereby facilitating efficient thermal transfer.

Figure 18:
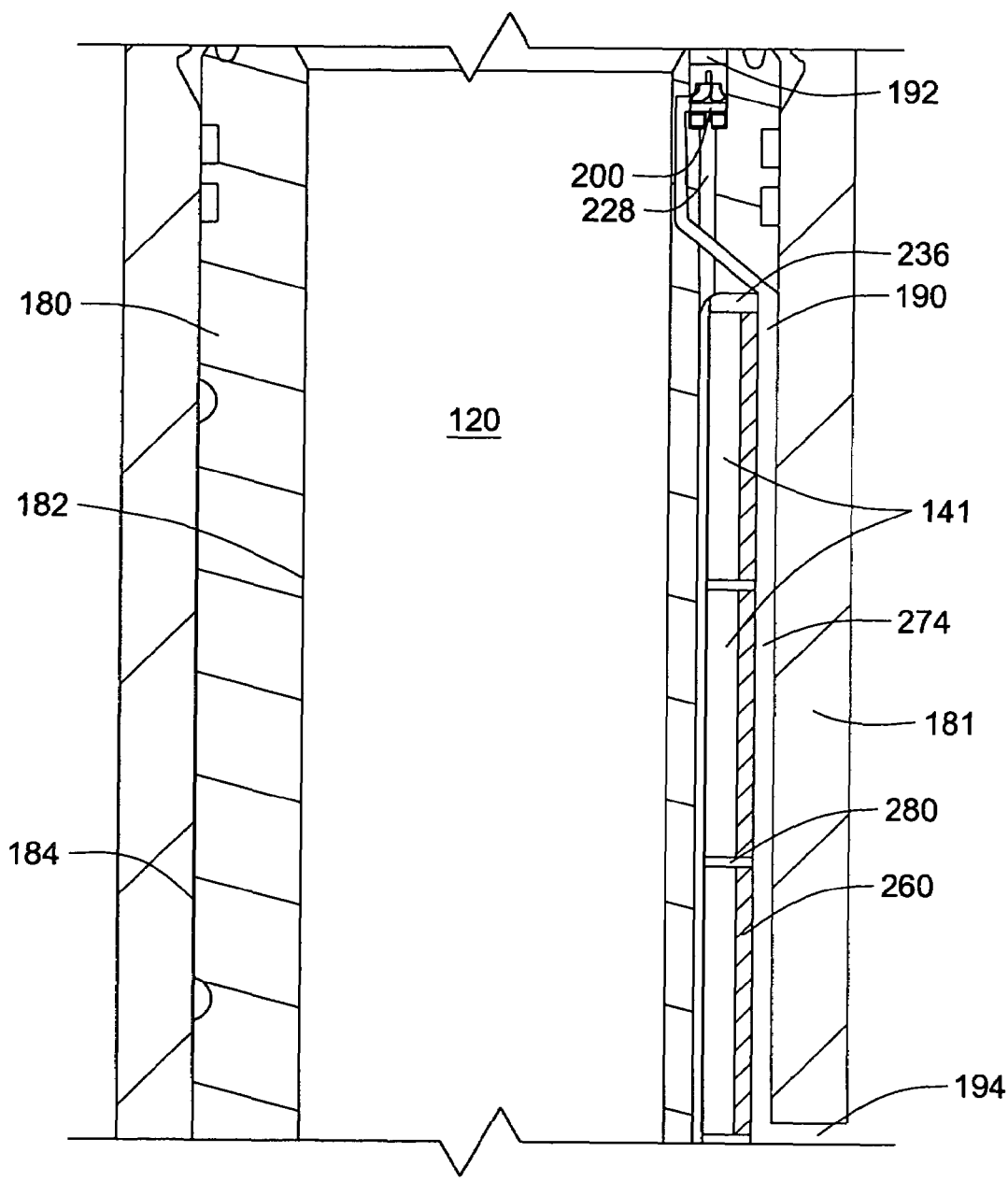
FIG. 18 is a cross-sectional view of the cylindrical unit of FIG. 17.

Referring now to FIG. 18, a route for a flow of drilling fluid or other heat sink 274 through the hollow passageway 190 may be directed to generally avoid interference with a conductor 228 or other electrical components 141 embedded within the cylindrical unit 180 wall 181, while enabling conductive heat transfer between an electrical component 141, a thermoelectric cooling device 260 coupled thereto, and a heat sink 274 flowing within the hollow passageway 190. As previously discussed, a hollow passageway 190 may proceed from an inlet 192 to an outlet 194, where the inlet 192 is located on an internal surface 182 or end 186 of the wall, and an outlet is located on an internal surface 182, external surface 184, or end 186 of the wall. A route of the hollow passageway 190 within the wall 181, however, may vary to allow isolation of selected electrical components 141, while allowing thermal communication between a heat sink 274 directed therethrough, a thermoelectric cooling device 260, and other electrical components 141.

In certain embodiments, a system for cooling electrical components in accordance with the present invention may be implemented in conjunction with embodiments of the downhole generator assembly 200 previously disclosed. This may enable a continuous and reliable supply of power to the thermoelectric cooling device 260 as well as to other electrical components 141 downhole. Specifically, a conductor 228 connected to the downhole generator assembly 200 or other cable 143 in communication with the conductor 228 may be attached to a thermoelectric cooling device 260 in and/or other electrical components 141 to power the same. In this case, a hollow passageway 190 may be routed to allow a flow of drilling fluid or other heat sink 274 to first actuate the downhole generator assembly 200, and then be directed away from the conductor 228 and other sensitive electrical components 141 associated with the generator assembly 200 to proceed along exposed surfaces ("hot sides") of thermoelectric cooling devices 260 coupled to selected electrical components 141 to extract heat therefrom. Potting material 280 in accordance with the present invention may be selectively implemented between thermoelectric cooling devices 260 and/or other electrical components 141 to avoid shorting the electrical system or otherwise interfering with electrical transmission and/or conductivity.

Figure 19:
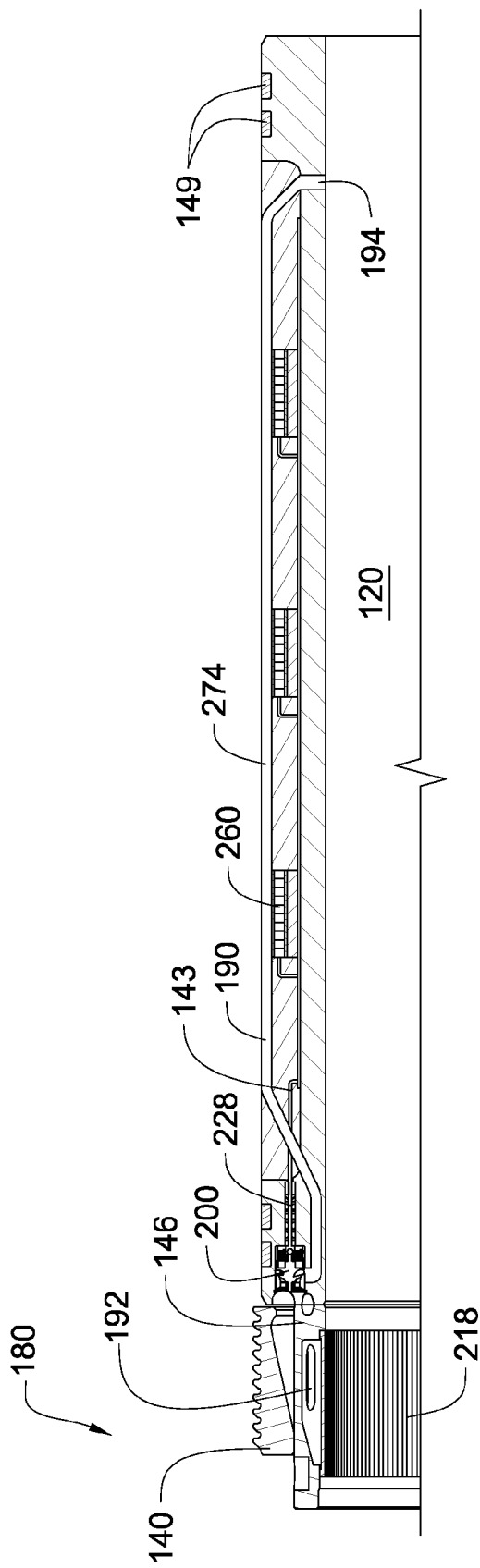
FIG. 19 is a cross-sectional view of an alternate embodiment of a cylindrical unit and thermoelectric cooling system in accordance with the present invention.
Figure 20:
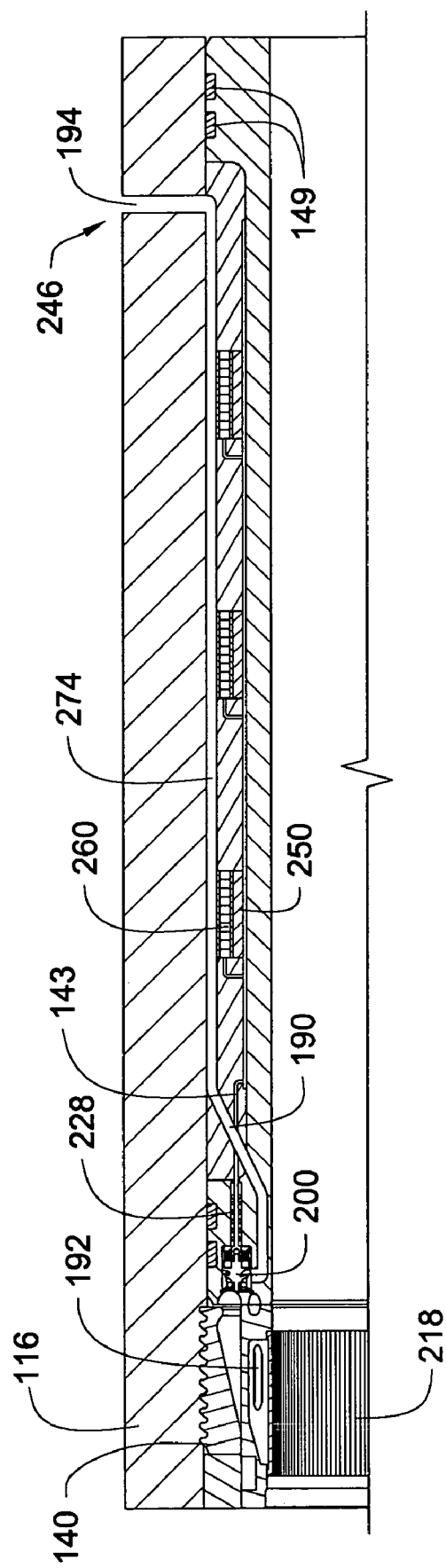
FIG. 20 is a cross-sectional view of a second alternate embodiment of a cylindrical unit and thermoelectric cooling system in accordance with certain embodiments of the present invention.

Referring now to FIGS. 19 and 20, a heat sink 274 may be directed to release heat transferred from an electrical component 141 and attached thermoelectric cooling device 260 to the central bore 120 of the drill string 14, or to the annulus 11 alongside the drill string 14, depending on the location of the outlet 194. Where the heat sink 274 serves a dual purpose in both transferring heat from electrical components 141 and actuating a downhole generator assembly 200, an outlet 194 of the hollow passageway 190 that corresponds to an external surface 184 of the cylindrical unit 180 may facilitate efficient energy generation while allowing adequate thermal transfer due to a substantial pressure differential between the inlet 192 and the outlet 194. Where the cylindrical unit 180 resides within a host tool 116 or portion of drill string, the outlet 194 may substantially correspond to an opening 246 in a wall of the host tool 116 to enable a similar pressure differential. Alternatively, an outlet 194 of the hollow passageway 190 may correspond to an internal surface 182 of the cylindrical unit 180 such that a flow of drilling fluid or other heat sink 274 through the passageway 190 may be substantially passive, or may be facilitated by a vacuum or suction device known to those in the art. In any case, heat is dissipated by the heat sink 274 to a location remote from the electrical component 141, thereby moderating electrical component 141 temperatures and promoting effective and reliable component 141 operation and electrical transmission.

We claim:

1. A thermoelectric cooling system for cooling electrical components downhole, comprising:

a substantially cylindrical housing comprising a central bore adapted to accommodate a flow of drilling fluid, and also comprising a wall having an inlet, an outlet, and a hollow passageway therebetween which is separate of the central bore, said hollow passageway adapted to accommodate a portion of the flow of drilling fluid;

at least one electrical component coupled to said substantially cylindrical housing; and a thermoelectric cooling device coupled to said at least one electrical component, at least a portion of said thermoelectric cooling device in contact with said portion of the flow of drilling fluid within said hollow passageway.

2. The thermoelectric cooling system of claim 1, further comprising:

a turbine rotatably secured within said hollow passageway, said turbine adapted to rotate in response to said flow of drilling fluid through said hollow passageway;

at least one generator operatively connected to said turbine and contained within said hollow passageway, said generator adapted to generate electricity upon rotation of said turbine; and at least one conductor attached to said at least one generator and said thermoelectric cooling device to supply electricity to said thermoelectric cooling device.

3. The thermoelectric cooling system of claim 1, said thermoelectric cooling device comprising a first surface, a second surface, and means for transferring heat from said first surface to said second surface.

4. The thermoelectric cooling system of claim 3, wherein said first surface of said thermoelectric cooling device interfaces with said at least one electrical component, and wherein said second surface of said thermoelectric cooling device interfaces with said flow of drilling fluid to cool said at least one electrical component.

5. The thermoelectric cooling system of claim 1, further comprising a potting material substantially encapsulating exposed surfaces of said at least one electrical component.

6. The thermoelectric cooling system of claim 1, wherein said substantially cylindrical housing is selected from the group consisting of a downhole tool, a drill pipe, a network node, and a pipe insert member.

7. The thermoelectric cooling system of claim 1, wherein said inlet of said hollow passageway and said outlet of said hollow passageway each correspond to a location selected from the group consisting of an inner surface of said wall, an outer surface of said wall, and an end of said wall.

8. The thermoelectric cooling system of claim 1, further comprising a filter proximate said inlet to filter said flow of drilling fluid.

9. The thermoelectric cooling system of claim 1, further comprising a regulating element secured within said hollow passageway proximate said inlet to regulate said flow of drilling fluid from said inlet to said outlet.

10. The thermoelectric cooling system of claim 1, wherein said portion of said thermoelectric cooling device exposed to said flow of drilling fluid is coated with a material selected from the group consisting of diamond, tungsten, carbide and steel.

11. A system for cooling electronic components in a downhole environment, comprising:

a drill string having a central bore therethrough;

a substantially cylindrical housing adapted to reside within at least a portion of said central bore, said housing being adapted to accomate a flow of drilling fluid through a housing central passage and also comprising a wall having an inlet, an outlet, and a hollow passageway therebetween which is separate of the housing central bore, said hollow passageway adapted to promote a portion of the flow of drilling fluid therethrough;

at least one electrical component residing within said wall proximate said hollow passageway; and a thermoelectric cooling device coupled to said at least one electrical component, at least a portion of said thermoelectric cooling device in contact with said portion of the flow of drilling fluid within said hollow passageway.

12. The system of claim 11, further comprising a turbine rotatably secured within said hollow passageway, said turbine adapted to rotate in response to said flow of drilling fluid through said hollow passageway;

at least one generator operatively connected to said turbine and contained within said hollow passageway, said generator adapted to generate electricity upon rotation of said turbine; and at least one conductor attached to said at least one generator and said thermoelectric cooling device to supply electricity to said thermoelectric cooling device.

13. The system of claim 11, said thermoelectric cooling device comprising a first surface, a second surface, and means for transferring heat from said first surface to said second surface.

14. The system of claim 13, wherein said first surface of said thermoelectric cooling device interfaces with said at least one electrical component, and wherein said second surface of said thermoelectric cooling device interfaces with said flow of drilling fluid to transfer heat from said at least one electrical component to said flow of drilling fluid.

15. The system of claim 11, further comprising a potting material substantially encapsulating exposed surfaces of said at least one electrical component.

16. The system of claim 11, wherein each of said inlet and said outlet of said hollow passageway corresponds to a location selected from the group consisting of an inner surface of said wall, an outer surface of said wall, and an end of said wall.

17. The system of claim 11, further comprising a filter proximate said inlet to filter said flow of drilling fluid.

18. The system of claim 11, further comprising a regulating element secured within said hollow passageway substantially adjacent said turbine to regulate said flow of drilling fluid from said inlet to said outlet.

19. The system of claim 11, wherein said portion of said thermoelectric cooling device exposed to said flow of drilling fluid is coated with a material selected from the group consisting of diamond, tungsten, carbide and steel.

20. A method for cooling electrical components in a downhole drill string, comprising:

providing a downhole drill string having a central bore;

integrating a substantially cylindrical housing into said downhole drill string, said substantially cylindrical housing having a housing central bore substantially corresponding to said drill string central bore;

integrating into a wall of said substantially cylindrical housing a hollow passageway separate of the housing central bore having an inlet and an outlet, said hollow passageway adapted to accommodate a portion of the flow of drilling fluid;

securing at least one electrical component within said wall substantially adjacent said hollow passageway;

coupling to said at least one electrical component at least one cooling device, at least a portion of said at least one cooling device in contact with said portion of the flow of drilling fluid;

cooling, via said at least one cooling device, said at least one electrical component; and transferring, via said flow of drilling fluid, heat from said at least one cooling device to a location removed from said hollow passageway.

21. The method of claim 20, further comprising filtering said flow of drilling fluid proximate said inlet.

22. The method of claim 20, further comprising protecting exposed surfaces of said at least one electrical component via a potting material.

* * * * *